(12) United States Patent
Su et al.

(10) Patent No.: US 11,737,260 B2
(45) Date of Patent: Aug. 22, 2023

(54) MEMORY DEVICE AND METHOD FOR FORMING THE SAME

(71) Applicant: TAIWAN SEMICONDUCTOR MANUFACTURING CO., LTD., Hsinchu (TW)

(72) Inventors: Hsin-Wen Su, Yunlin County (TW); Yu-Kuan Lin, Taipei (TW); Lien-Jung Hung, Taipei (TW); Ping-Wei Wang, Hsinchu (TW); Chia-En Huang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 227 days.

(21) Appl. No.: 17/034,727

(22) Filed: Sep. 28, 2020

(65) Prior Publication Data
US 2022/0102366 A1    Mar. 31, 2022

(51) Int. Cl.
*H01L 21/321* (2006.01)
*H10B 20/20* (2023.01)
*H01L 29/66* (2006.01)
*H01L 29/04* (2006.01)
*H01L 29/06* (2006.01)

(52) U.S. Cl.
CPC .......... *H10B 20/20* (2023.02); *H01L 29/045* (2013.01); *H01L 29/0692* (2013.01); *H01L 29/66545* (2013.01)

(58) Field of Classification Search
None
See application file for complete search history.

(56) References Cited

U.S. PATENT DOCUMENTS

2020/0219896 A1* 7/2020 Mushiga .......... H01L 21/32139

OTHER PUBLICATIONS

Mitani et al., "Re-consideration of Influence of Silicon Wafer Surface Orientation on Gate Oxide Reliability from TDDB Statistics Point of View", IEEE International Reliability Physics Symposium, 2010, 3D.4.1-3D.4.7, total 7 pages.

* cited by examiner

*Primary Examiner* — Joseph C. Nicely
*Assistant Examiner* — Lamont B Koo
(74) *Attorney, Agent, or Firm* — Birch, Stewart, Kolasch & Birch, LLP

(57) ABSTRACT

A memory device includes a substrate, an active region, a first gate structure, a second gate structure, a first word line, and a second word line. The active region protrudes from a top surface of the substrate. The active region has at least one ring structure, in which when viewed from above, the ring structure has a first linear portion, a second linear portion, a first curved portion, and a second curved portion, the first curved portion connects first sides of the first and second linear portions, and the second curved portion connects second sides of the first and second linear portions. The first gate structure and the second gate structure are over the substrate and cross the active region. The first word line and the second word line are electrically connected to the first gate structure and the second gate structure, respectively.

20 Claims, 21 Drawing Sheets

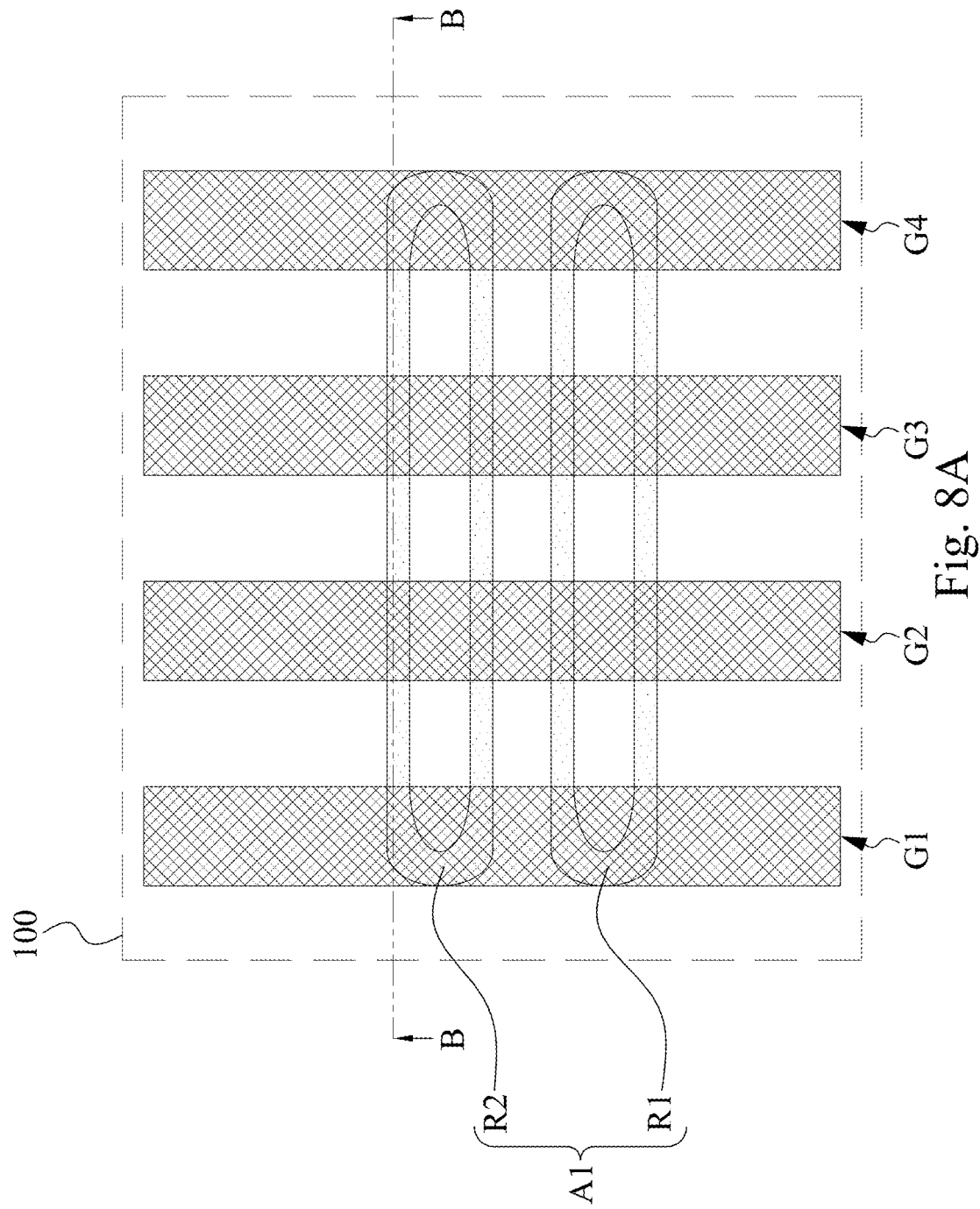

MEMORY DEVICE AND METHOD FOR FORMING THE SAME

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
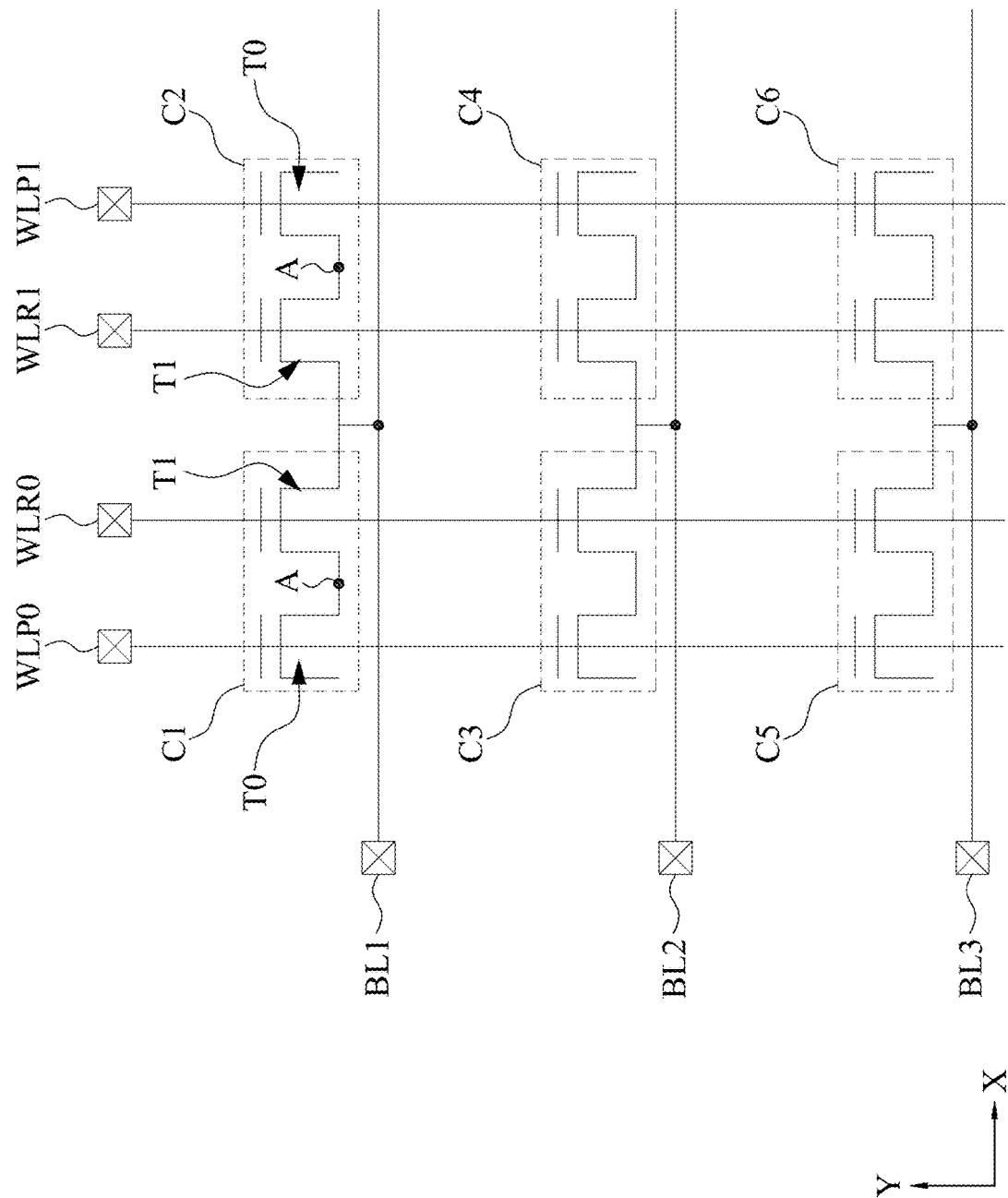
FIG. 1 is a schematic diagram of a memory device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The present invention includes an embodiment of a one-time programmable (OTP) memory cell. Herein, it may be that the OTP memory cell can be electronically programmed with data only once; and even though power is no longer supplied, programmed data in the OTP memory cell is retained.

FIG. 1 is a schematic circuit of a memory device in accordance with some embodiments. As depicted in FIG. 1, a memory device includes a plurality of OTP memory cells C1, C2, C3, C4, C5, and C6, a plurality of the word lines WLP0, WLR0, WLR1, WLP1, and a plurality of the bit lines BL1, BL2, BL3. The word lines WLP0, WLR0, WLR1, and WLP1 are arranged in X-direction, and each of the word lines WLP0, WLR0, WLR1, and WLP1 extends along Y-direction. The bit lines BL1, BL2, BL3 are arranged in Y-direction, and each of the bit lines BL1, BL2, BL3 extends along X-direction.

In some embodiments, each of the OTP memory cells C1-C6 includes a first transistor T0 and a second transistor T1. With respect to the OTP memory cell C1, a gate terminal of the first transistor T0 is electrically coupled to the word line WLP0, and a gate terminal of the second transistor T1 is electrically coupled to the word line WLR0. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first transistor T0 is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1.

With respect to the OTP memory cell C2, a gate terminal of the first transistor T0 is electrically coupled to the word line WLP1, and a gate terminal of the second transistor T1 is electrically coupled to the word line WLR1. A source/drain terminal of the first transistor T0 is floated, and the other source/drain terminal of the first transistor T0 is electrically coupled to a resistance node A. Herein, since the one source/drain terminal of the first transistor T0 does not have any effect on storing and reading data in the OTP memory cell C1, the one source/drain terminal of the first MOS transistor is floated. One source/drain terminal of the second transistor T1 is also coupled to the resistance node A, and the other source/drain terminal of the second transistor T1 is coupled to a bit line BL1. In some embodiments, the source/drain terminal of the first transistor T0 is electrically coupled to the source/drain terminal of the second transistor T1. In some embodiments, the OTP memory cells C1 and C2 share the same bit line BL1.

The OTP memory cell C3-C6 are similar to the OTP memory cells C1 and C2 as described above, and thus relevant details will not be repeated for brevity.

Generally, a gate of a transistor is formed by laminating conductive layers on an insulating layer. In a programming operation, an insulating layer of the gate of the first transistor T0 may be destroyed. The second transistor T1 serves as a switching element in order to select the OTP memory cell.

Figure 2A:
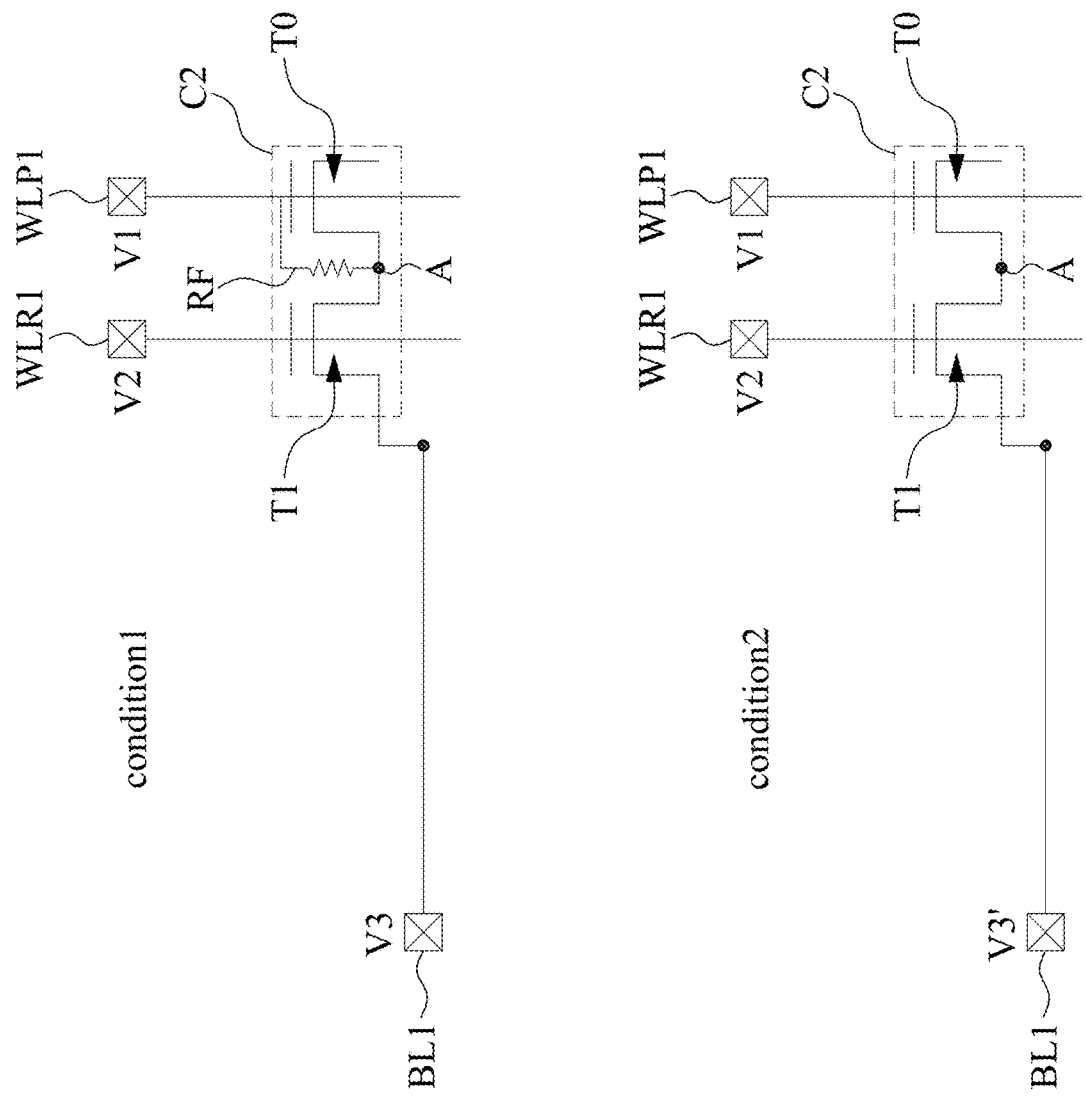
FIG. 2A is a schematic diagram for performing a programming operation to a memory device in accordance with some embodiments.
Figure 2B:
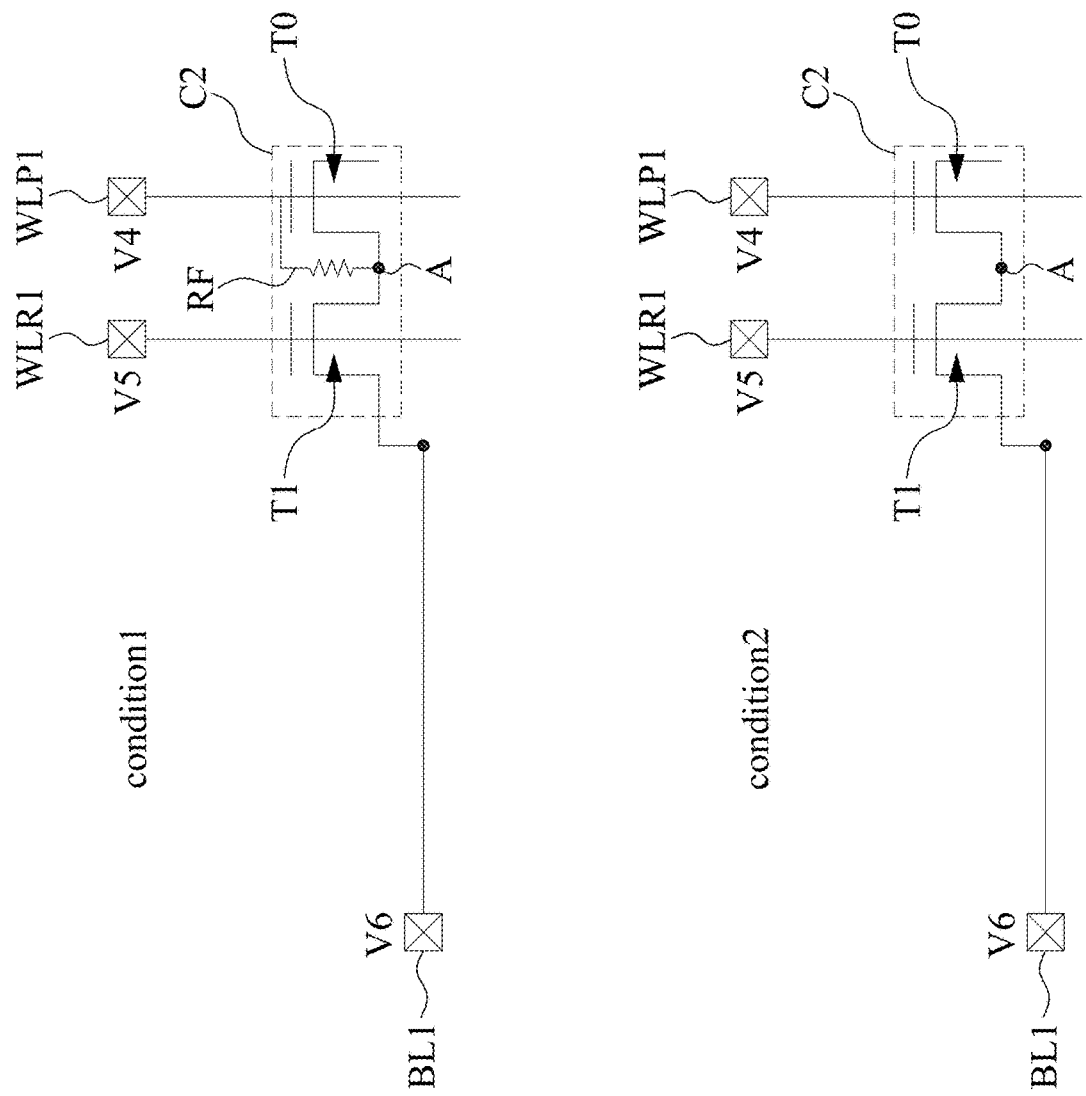
FIG. 2B is a schematic diagram for performing a read operation to a memory device in accordance with some embodiments.

FIG. 2A is a schematic diagram for performing a programming operation to a memory device in accordance with some embodiments. FIG. 2B is a schematic diagram for performing a read operation to a memory device in accordance with some embodiments. It is noted that in FIGS. 2A and 2B, for simplicity, only the OTP memory cell C2 is illustrated. During the programming operation, the bodies of the first and the second MOS transistors M0 and M1 of the OTP memory cell C2 are coupled to a ground voltage.

Reference is made to FIG. 2A, in which FIG. 2A illustrates two different conditions during a programming operation. In condition 1 of FIG. 2A, the word line WLP1 is supplied with a high level voltage V1, and the world line WLR1 is coupled to a voltage V2 having a lower level than the high level voltage V1. The bit line BL1 is coupled to a ground voltage V3. Herein, the voltage V2 is a voltage having a sufficient level to turn on the second transistor T1, and the high level voltage V1 is a voltage having a sufficient level to destroy an insulating layer (e.g., the gate dielectric layer 112 described in FIGS. 3A to 3C) included in a gate structure (e.g., the gate structures G1 and/or G4 described in FIGS. 3A to 3C) of the first transistor T0. In some embodiments, the voltage V2 may be about 1.2V to about 10V, which is sufficiently high to turn on the second transistor T1, and the high level voltage V1 may be higher than about 1.2V, such as about 5.3V. On the other hand, the ground voltage V3 can be regarded as having a voltage level of about 0V.

Since the gate of second transistor T1 is supplied with a voltage V2 that is sufficiently high to turn on the second transistor T1, the gate of the second transistor T1 is turned on, and thus the resistance node A is coupled to the ground voltage V3. The gate of the first transistor T0 is coupled to the high level voltage V1. Due to a difference of voltage level supplied to the gate (e.g., voltage V1) and voltage level supplied to the one terminal of the first transistor T0 (e.g., voltage V3), the insulating layer of the first transistor T0 is destroyed, i.e., broken down. When the insulating layer is destroyed, a current path is created between the word line WLP1 and the resistance node A. The resulting circuit can be regarded as having a resistance RF in the current path. Accordingly, in condition 1, the OTP memory cell C2 can be referred to as "programmed" after the programming operation, because the insulating layer of the first transistor T0 is destroyed, i.e., broken down.

In this configuration with the first transistor T0 coupled to the ground voltage V3, the insulating layer may not be reliably and/or consistently destroyed. In order to reliably destroy an insulating layer included in the gate structure of first transistor T0 during a programming operation, the insulating layer can be formed thinner than those of other transistors, such as the second transistor T1. Also, to increase programming reliability, the high level voltage V1 can have a higher voltage level than a predetermined voltage level, where the predetermined voltage level can destroy the insulating layer included in the gate structure of first transistor T0.

On the other hand, in condition 2 of FIG. 2A, the word line WLP1 is supplied with the high level voltage V1, and the world line WLR1 is coupled to the voltage V2 having a lower level than the high level voltage V1. The bit line BL1 is coupled to a voltage V3'. Here, the voltage V3' has a higher voltage level than the ground voltage V3 as described in condition 1 of FIG. 2A. For example, the voltage V3' may be about 1.2V, which is higher than the ground voltage V3 (e.g., about 0V). In some embodiments, the voltage V3' has substantially the same value as the voltage V2, such that the voltage difference between the gate terminal of the second transistor T1 and the source region terminal of the second transistor T1 may be about zero so that the second transistor T1 is turned off, and the source/drain terminal of the second transistor T1 connected to the first transistor T0 is floated. Even though the high level voltage V1 is applied to the first transistor T0 through the word line WLP1, an electric field will not be applied to the insulating layer of the second transistor T1 because the source/drain terminal of the first transistor T0 connected to the second transistor T1 is floated. In this way, the insulating layer of the first transistor T0 may not be broken down during the programming operation, the first transistor T0 remains its original function after the programming operation. Accordingly, in condition 2, the OTP memory cell C2 can be referred to as "un-programmed" after the programming operation, because the insulating layer of the first transistor T0 is not destroyed.

Reference is made to FIG. 2B, in which FIG. 2B illustrates two different conditions during a read operation. It is noted that the condition 1 of FIG. 2B follows the condition 1 of FIG. 2A, and the condition 2 of FIG. 2B follows the condition 2 of FIG. 2A.

In a read operation, the word line WLP1 is supplied with a power voltage V4, and the word line WLR1 is coupled to the power voltage V5. The bit line BL1 is precharged with a ground voltage level V6. The power voltage V5 is sufficiently high to turn on the second transistor T1.

In condition 1 of FIG. 2A where the insulating layer included in the gate structure of first transistor T0 is destroyed (breakdown state), the voltage of the bit line BL1 may increase, and a current path between the gate of the first transistor T0 and the bit line BL1 may increase as well. On the other hand, in condition 2 where the insulating layer included in the gate structure of first transistor T0 is not destroyed, the voltage level of bit line BL1 does not rise and therefore retains the precharged voltage level (i.e., ground voltage level V6), and thus there is no current path between the gate of the first transistor T0 and the bit line BL1. Data can be read depending on whether there is current on the bit line BL1. For instance, in condition 1, if the voltage or the current of the bit line BL increases because of the breakdown of the insulating layer of the first transistor T0, data '1' can be determined. On the other hand, if the voltage or the current of the bit line BL does not rise, data '0' can be determined. That is, if the insulating layer breaks down, the bit line BL1 may have a logic level of '1'; if the insulating layer does not break down, the bit line BL1 may have a logic level of '0'.

Figure 3A:
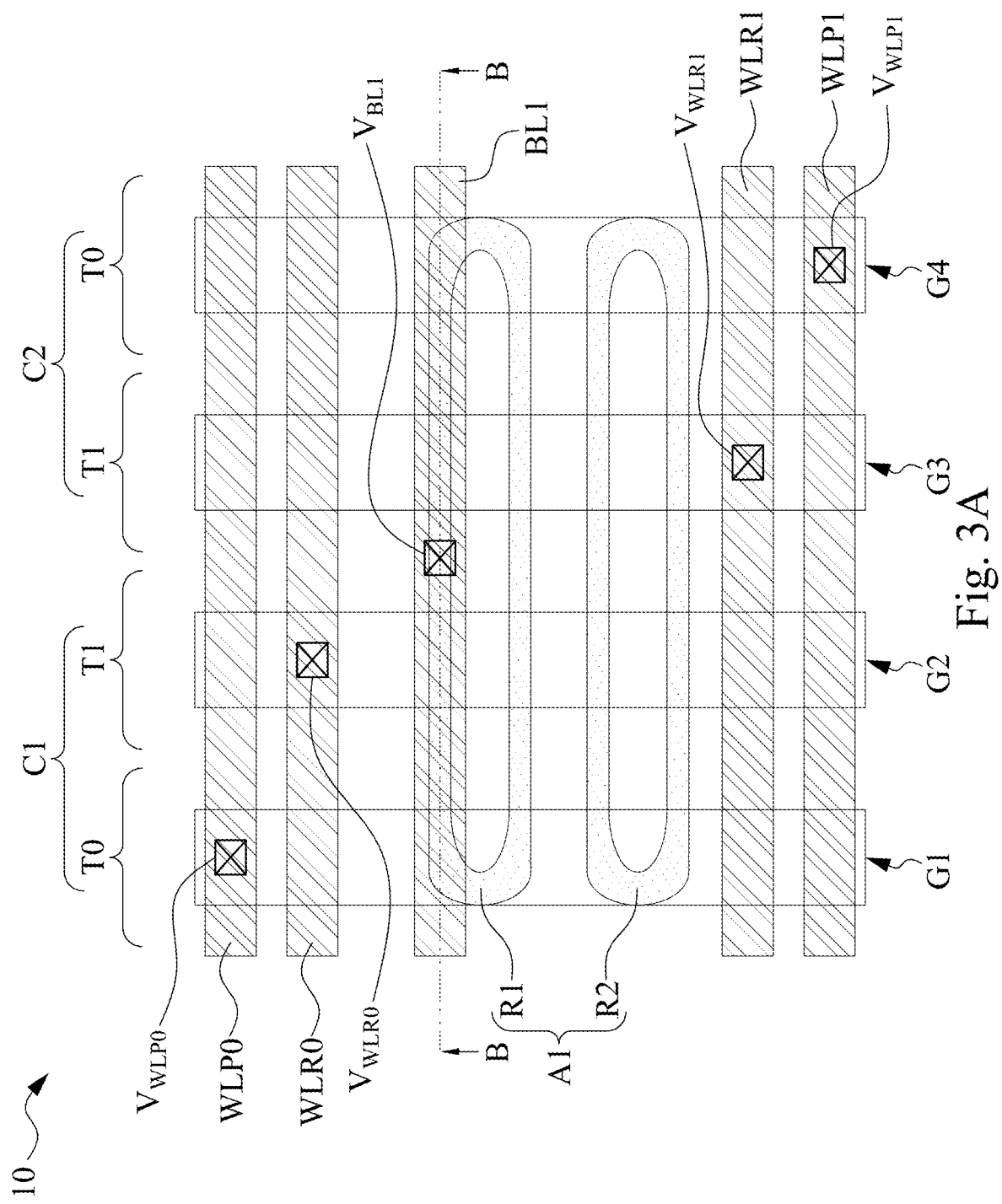
FIG. 3A is a top view of a memory device in accordance with some embodiments.
Figure 3B:
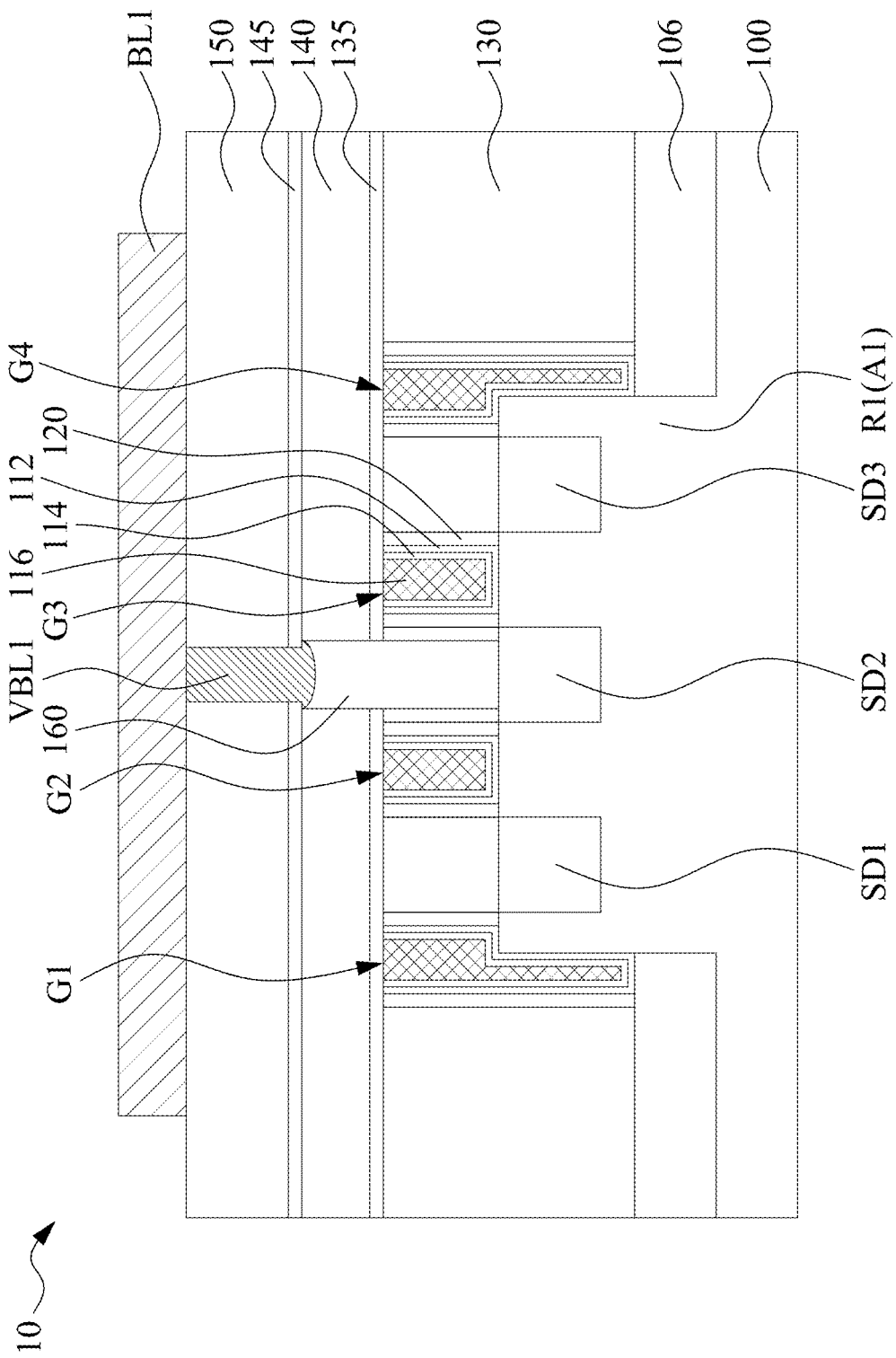
FIG. 3B is a cross-sectional view of the memory device of FIG. 3A in accordance with some embodiments.
Figure 3C:
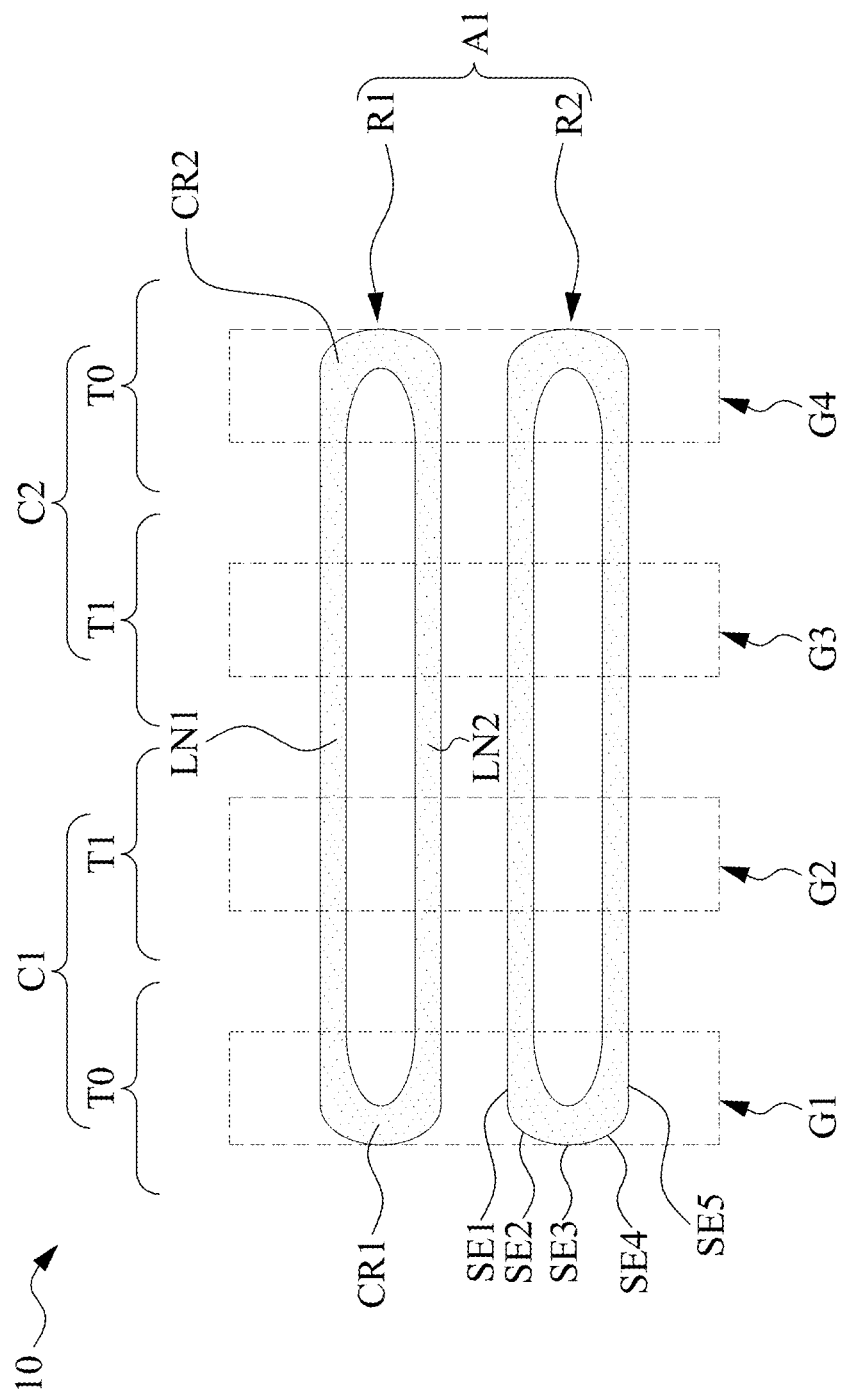
FIG. 3C is an enlarged view of FIG. 3A in accordance with some embodiments.

FIG. 3A is a top view of a memory device 10 in accordance with some embodiments. FIG. 3B is a cross-sectional view along line B-B of the memory device 10 of FIG. 3A in accordance with some embodiments. FIG. 3C is an enlarged view of FIG. 3A. It is noted that some elements of FIG. 3B are not illustrated in FIG. 3A for brevity.

It is noted that the memory device 10 described in FIGS. 3A to 3C corresponds to the circuit as described in FIG. 1. For example, the memory device 10 of FIGS. 3A to 3C includes OTP memory cells C1 and C2, in which each of the OTP memory cells C1 and C2 includes transistors T0 and T1. In some embodiments, the OTP memory cells C3 to C6 of FIG. 1 have similar or the same structure as the OTP memory cells C1 and C2 discussed in FIGS. 3A to 3C, and thus relevant details will not be repeated for brevity.

The memory device 10 includes a substrate 100. In some embodiments, the substrate 100 may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

An active region A1 is disposed over the substrate 100 and are laterally surrounded by an isolation structure 106 formed of dielectric material. The isolation structure 106 may be a shallow trench isolation (STI) structure, a deep trench isolation (DTI) structure, another suitable isolation structure(s), a combination of the foregoing, or the like. In some embodiments where the STI region 106 is made of oxide (e.g., silicon oxide), the active region A1 can be interchangeably referred to as oxide defined (OD) regions. In some embodiments, the active regions A1, A2, A3 are semiconductor fins protruding from the substrate 100.

A plurality of gate structures G1, G2, G3, and G4 are disposed over the substrate 100. In some embodiments, the gate structures G1 to G4 cross the active region A1. In some embodiments, each of the gate structures G1 to G4 includes a gate dielectric layer 112, a work function metal layer 114, and a filling metal 116. In some embodiments, the gate structures G1 and G2 are belong to the transistors T0 and T1 of the OTP memory cell C1, respectively. On the other hand, the gate structures G3 and G4 are belong to the transistors T1 and T0 of the OTP memory cell C2, respectively.

In some embodiments, the gate dielectric layers 112 of gate structures G1-G4 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers 112 are oxide layers. The gate dielectric layers 112 may be formed by a deposition processes, such as chemical vapor deposition (CVD), physical vapor deposition (PVD), atomic layer deposition (ALD), plasma enhanced CVD (PECVD) or other suitable techniques. In some embodiments, the gate dielectric layers 112 of the gate structures G1 and G4 are thinner than the gate dielectric layers 112 of the gate structures G2 and G3, as the gate dielectric layers 112 of the gate structures G1 and G4 may act as the insulting layer of the first transistors T0 described in FIGS. 1 to 2B.

In some embodiments, the work function metal layers 114 of the gate structures G1-G4 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function metal layers 114 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the filling metals 116 of gate structures G1-G4 may include tungsten (W). In some other embodiments, the filling metals 116 include aluminum (Al), copper (Cu) or other suitable conductive material. The filling metals 116 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

As mentioned above with respect to FIG. 1, in some embodiments, the insulating layer (e.g., the dielectric layer 112) of gate structure of first transistor T0 can be formed thinner than those of other transistors, such as the second transistor T1. Accordingly, in some embodiments, the dielectric layers 112 of the gate structures G1 and G4 may be thinner than the dielectric layers 112 of the gate structures G2 and G3.

A plurality of gate spacers 120 are disposed on opposite sidewalls of the gate structures G1-G4. In some embodiments, the gate spacers 120 may include $SiO_2$, $Si_3N_4$, $SiO_xN_y$, SiC, SiCN films, SiOC, SiOCN films, and/or combinations thereof.

Reference is made to FIGS. 3A and 3C, in which FIG. 3C is an enlarged view of FIG. 3A. It is noted that only the active region A1 and the gate structures G1 to G4 are illustrated in FIG. 3C, and the gate structures G1 to G4 are drawn in dash-line for brevity.

When viewed from top of the memory device 10, the active region A1 includes two ring structures R1 and R2. In some embodiments, the ring structures R1 and R2 have substantially the same shape. The ring structures R1 and R2 are arranged along a length wise direction of the gate structures G1 to G4. It is noted that the number of the ring structures is merely used to explain, less or more ring structures may be employed in some other embodiments.

In FIG. 3C, each of the ring structures R1 and R2 includes two linear portions LN1 and LN2, and two curved portions CR1 and CR2. In some embodiments, the linear portions LN1 and LN2 are arranged along the lengthwise direction of the gate structures G1 to G4, while a lengthwise direction of the linear portions LN1 and LN2 is substantially perpendicular to the lengthwise direction of the gate structures G1 to G4. The curved portion CR1 connects one side of the linear portion LN1 to one side of the linear portion LN2, and the curved portion CR2 connects another side of the linear portion LN1 to another side of the linear portion LN2. The linear portions LN1, LN2 and the curved portions CR1, CR2 constitute each of the ring structures R1 and R2.

With respect to the curved portion CR1 of the ring structures R1 and R2, the outer sidewall (or outer edge) of the curved portion CR1 has segments SE1, SE2, SE3, SE4, SE5. In some embodiments, the segments SE1 and SE5 are opposite to each other and have a (010) crystal plane. In some embodiments, the segments SE2 and SE4 are opposite to each other and have a (110) crystal plane. In some embodiments, the segment SE3 have a (100) crystal plane. Because the gate structure G1 crosses the curved portion CR1, the gate structure G1 substantially contacts the segments SE1, SE2, SE3, SE4, SE5 of the curved portion CR1. That is, the gate structure G1 contacts (010), (110), and (100) crystal planes of the curved portion CR1. In some embodiments, the relationship between the curved portion CR2 and the gate structure G4 is the same as described with respect to the curved portion CR1 and the gate structure G1, and thus relevant details are omitted for brevity.

On other hand, with respect to the linear portions LN1 and LN2, each of the linear portions LN1 and LN2 has opposite sidewalls having (010) crystal plane, which is the same as the segments SE1 and SE5 of the curved portion CR1. Because the gate structure G2 crosses the linear portions LN1 and LN2, the gate structure G2 substantially contacts the sidewalls of the linear portions LN1 and LN2 having (010) crystal plane. In some embodiments, the relationship between the linear portions LN1, LN2 and the gate structure G2 is the same as described with respect to the linear portions LN1, LN2 and the gate structure G3, and thus relevant details are omitted for brevity.

In some embodiments, the gate structure G1 contacts the (010), (110), and (100) crystal planes of the active region A1, while the gate structure G2 only contacts the (010) crystal plane of the active region A1. That is, the gate structure G2 does not contact the (110) and (100) crystal planes of the active region A1.

When viewed from top of the memory device 10, the gate structure G1 form two interfaces with the ring structure R1 of the active region A1. For example, the gate structure G1 form interfaces with an inner sidewall and an outer sidewall of the curved portion CR1. On the other hand, the gate structure G2 form four interfaces with the ring structure R1 of the active region A1. For example, the gate structure G1 form interfaces with opposite sidewalls of the linear portion LN1 and opposite sidewalls of the linear portion LN2 of the active region A1. Accordingly, interfaces between the gate structure G1 and the active region A1 are less than interfaces between the gate structure G2 and the active region A1.

However, the curved portions CR1 can increase the length of the interfaces between the gate structure G1 and the active region A1. For example, the total length of the inner sidewall and the outer sidewall of the curved portion CR1 that form interfaces with the gate structure G1 is greater than the total length of the opposite sidewalls of the linear portion LN1 and opposite sidewalls of the linear portion LN2 that form interfaces with the gate structure G2. In some embodiments, the contact area between the gate structure G1 and the top surface of active region A1 (e.g., the area that the gate structure G1 overlaps the active region A1 in FIG. 3A) is greater than the contact area between the gate structure G2 and the top surface of active region A1 (e.g., the area that the gate structure G2 overlaps the active region A1 in FIG. 3A).

The increased contact area between the gate structure G1 and the active region A1 also results in increased length of the edges (or corners) of the active region A1 that contact the gate structure G1. Because the gate dielectric layer of the gate structure G1 contacts edges (or corners) of the active region A1, the gate dielectric layer may cause high electric fields at these edges (or corners) due to "point discharge effect." The electric fields may contribute to the voltage for destroying the gate dielectric layer of the transistors T0 of memory device 10 as discussed above with respect to FIGS. 1 to 2B. Accordingly, the breakdown voltage of the transistors T0 of memory device 10 can be reduced, and thus the power of the memory device may also be reduced.

Referring to FIG. 3B, a plurality of source/drain structures SD1, SD2, and SD3 are disposed in the active region A1 over the substrate 100. For example, the source/drain structures SD1 and SD2 are disposed on opposite sides of the gate structure G2, the source/drain structures SD2 and SD3 are disposed on opposite sides of the gate structure G3, respectively. In some embodiments, the source/drain structures SD1 to SD3 may be may be formed by performing an epitaxial growth process that provides an epitaxy material over the substrate 100, and thus the source/drain structures SD1 to SD3 can also be interchangeably referred to as epitaxy structures SD1 to SD3 in this context. In various embodiments, the source/drain structures SD1 to SD3 may include Ge, Si, GaAs, AlGaAs, SiGe, GaAsP, SiP, or other suitable material.

An interlayer dielectric (ILD) layer 130 is disposed over the substrate 100, over the source/drain structures SD1 to SD3, and surrounding the gate structures G1 to G4. In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 130 may be formed using, for example, CVD, ALD, spin-on-glass (SOG) or other suitable techniques.

An etch stop layer (ESL) 135, an ILD layer 140, a etch stop layer (ESL) 145, and an ILD layer 150 are disposed in sequence over the gate structures G1 to G4 and the ILD layer 130. The materials and the formation method of the ILD layers 140 and 150 are similar to those of the ILD layer 130 described above. The ESLs 135 and 145 may include materials different from the ILD layers 130, 140, and 150. In some embodiments, the ESLs 135 and 145 include silicon nitride, silicon oxynitride or other suitable materials. The ESLs 135 and 145 can be formed using, for example, plasma enhanced CVD, low pressure CVD, ALD or other suitable techniques.

A source/drain contact 160 extends through the ILD layer 140, the ESL 135, and the ILD layer 130 and contacts the source/drain structure SD2. In some embodiments, the source/drain contact 160 may include a linear and a filling metal. The linear is between filling metal and the underlying source/drain structure SD2. In some embodiments, the linear assists with the deposition of filling metal and helps to reduce diffusion of a material of filling metal through the gate spacers 120. In some embodiments, the linear includes titanium (Ti), titanium nitride (TiN), tantalum (Ta), tantalum nitride (TaN), or another suitable material. The filling metal includes a conductive material, such tungsten (W), copper (Cu), aluminum (Al), ruthenium (Ru), cobalt (Co), molybdenum (Mo), nickel (Ni), or other suitable conductive material. In some embodiments, a silicide layer may be disposed between the source/drain contact 160 and the source/drain structure SD2.

A via $V_{BL1}$ extends through the ILD layer 150 and the ESL 145, and contacts the source/drain contact 160. In some embodiments, the via $V_{BL1}$ includes a conductive material, such tungsten (W). Other conductive materials may be used for the via $V_{BL1}$, such as copper (Cu), aluminum (Al), ruthenium (Ru), cobalt (Co), molybdenum (Mo), nickel (Ni), or the like. The via $V_{BL1}$ can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

A bit line BL1 overlies the ILD layer 150 and contacts the via $V_{BL1}$. In some embodiments, the bit line BL1 may include copper (Cu), aluminum (Al), ruthenium (Ru), cobalt (Co), molybdenum (Mo), nickel (Ni), tungsten (W), or the like. The bit line BL1 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof. In some embodiments, the bit line BL1 is electrically connected to the source/drain structure SD2 between the gate structures G2 and G3.

In FIG. 3A, vias $V_{WLP0}$, $V_{WLR0}$, $V_{WLR1}$, and $V_{WLR1}$ may extend through extends through the ILD layer 150, the ESL 145, the ILD layer 140, and the ESL 135 (see FIG. 3B), and contact the gate structures G1, G2, G3, and G4, respectively. Then, word lines WLP0, WLR0, WLR1, WLP1 are disposed over and contacting the vias $V_{WLP0}$, $V_{WLR0}$, $V_{WLR1}$, and $V_{WLP1}$, respectively. In some embodiments, the material and the formation method of the vias $V_{WLP0}$, $V_{WLR0}$, $V_{WLR1}$, and $V_{WLR1}$ are the same as those of the via $V_{BL1}$. In some embodiments, the material and the formation method of, the word lines WLP0, WLR0, WLR1, WLP1 are the same as those of the bit line BL1.

FIGS. 4A to 9B illustrate a method in various stages of fabricating the memory device 10 as described in FIGS. 3A to 3C in accordance with some embodiments of the present disclosure.

Figure 4A:
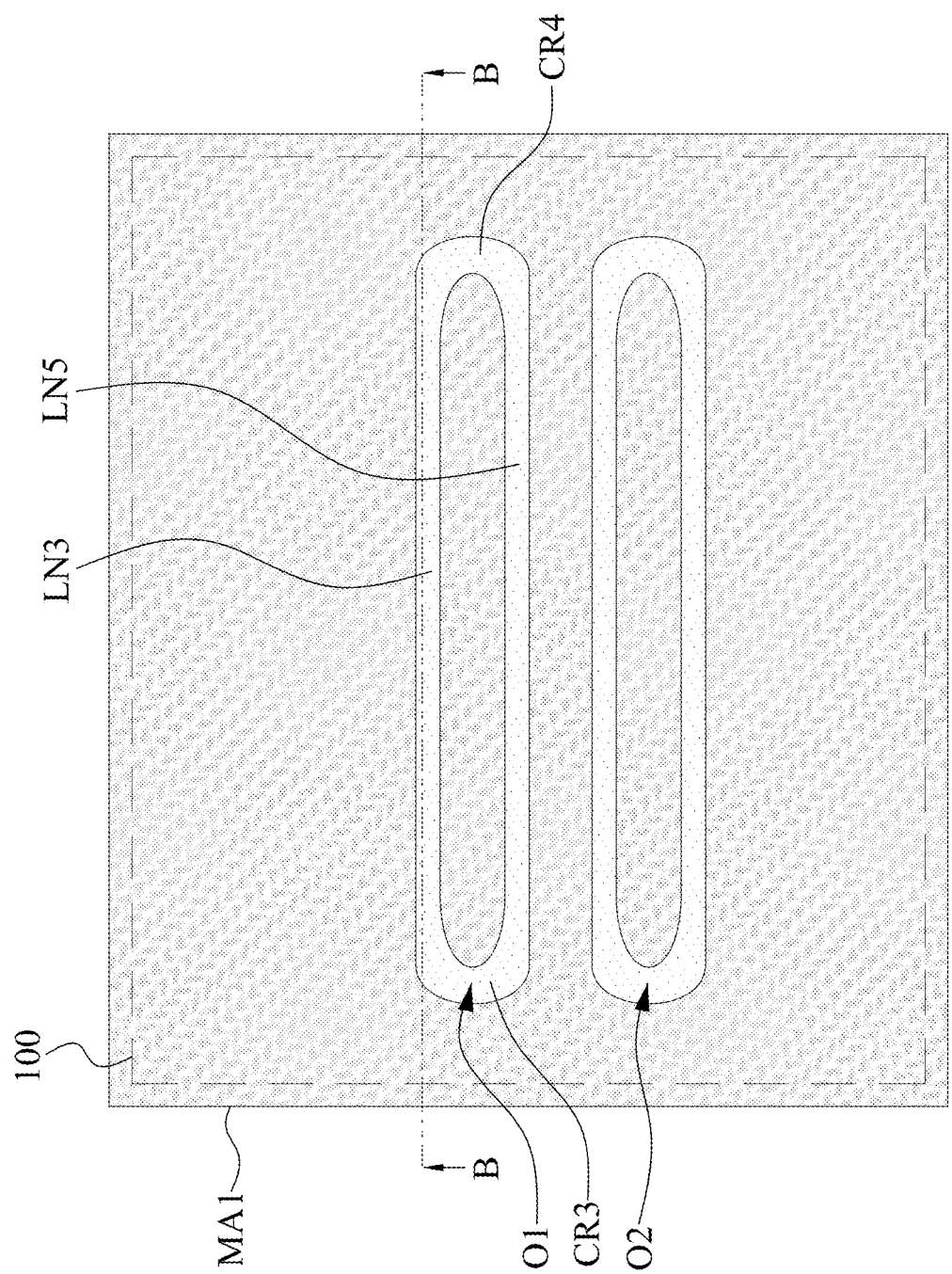
FIGS. 4A to 9B illustrate a method in various stages of fabricating the memory device in accordance with some embodiments of the present disclosure.
Figure 4B:
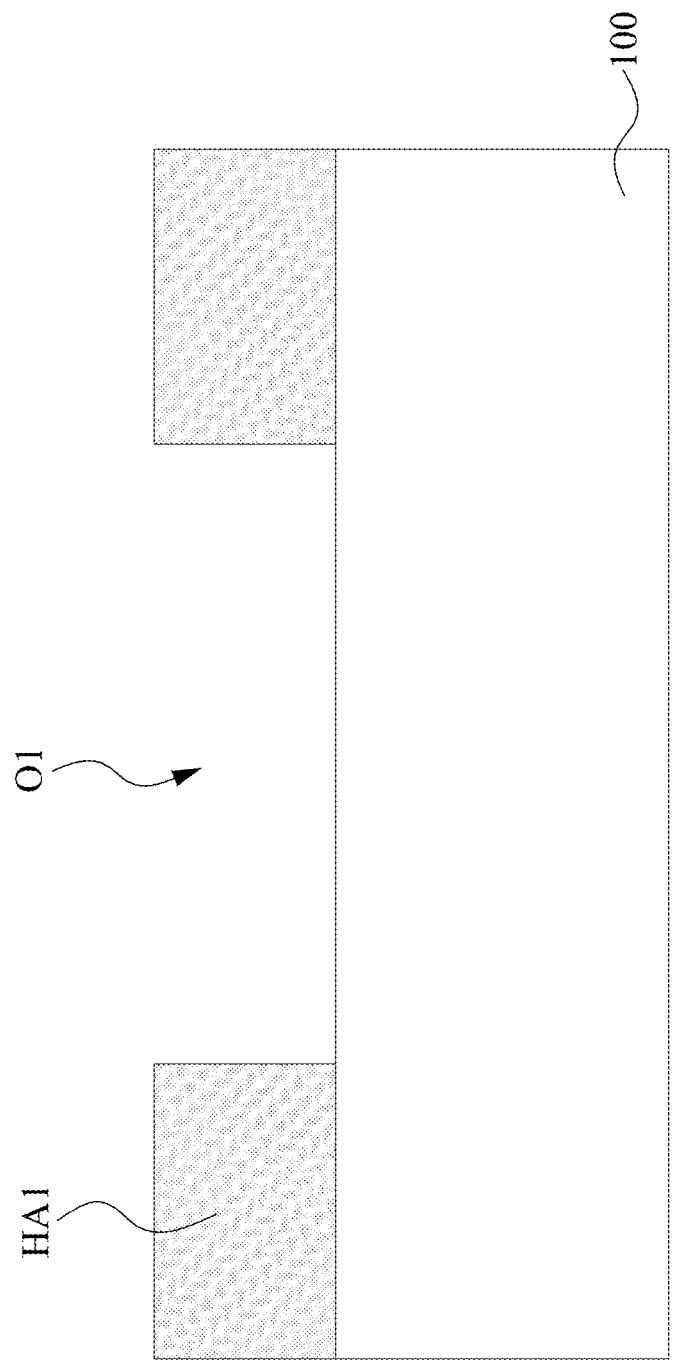

Reference is made to FIGS. 4A and 4B, in which FIG. 4A is a top view of a memory device, FIG. 4B is a cross-sectional view along line B-B of FIG. 4A. A patterned mask MA1 is formed over a substrate 100. The patterned mask MA1 may be a photoresist layer, and may be patterned using photolithography. In some embodiments, the patterned mask MA1 includes openings O1 and O2, in which openings O1 and O2 define the shape of the active region formed in later step (e.g., the active region A1 in FIGS. 5A and 5B). In some embodiments, each of the openings O1 and O2 has a ring shape when viewed from above. For example, each of the openings O1 and O2 includes two linear portions LN3 and LN4, and two curved portions CR3 and CR4. The curved portion CR3 connects one side of the linear portion LN3 to one side of the linear portion LN4, and the curved portion CR4 connects another side of the linear portion LN3 to another side of the linear portion LN4. The linear portions LN3, LN4 and the curved portions CR3, CR4 constitute the ring shape of the openings O1 and O2.

Figure 5A:
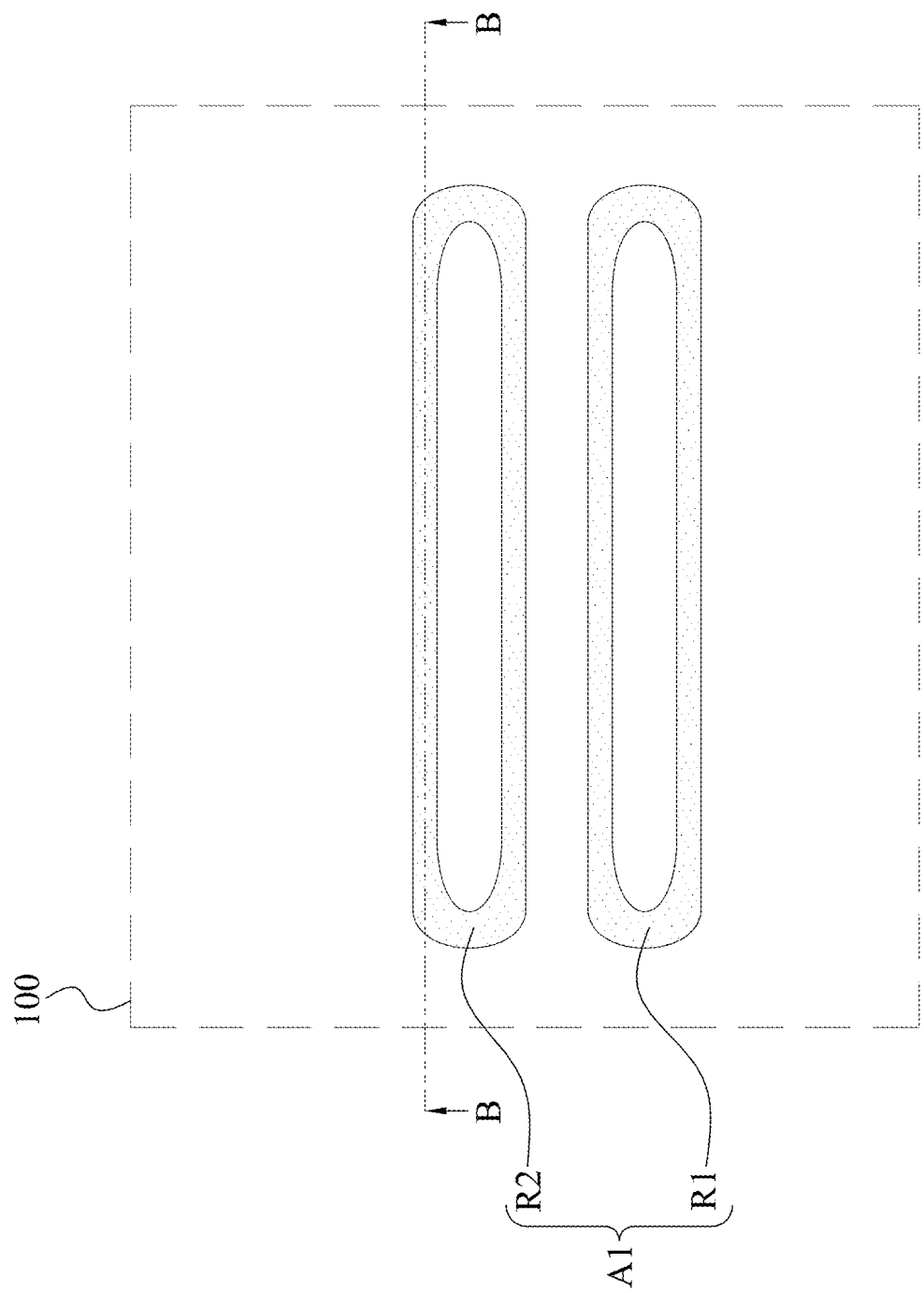
Figure 5B:
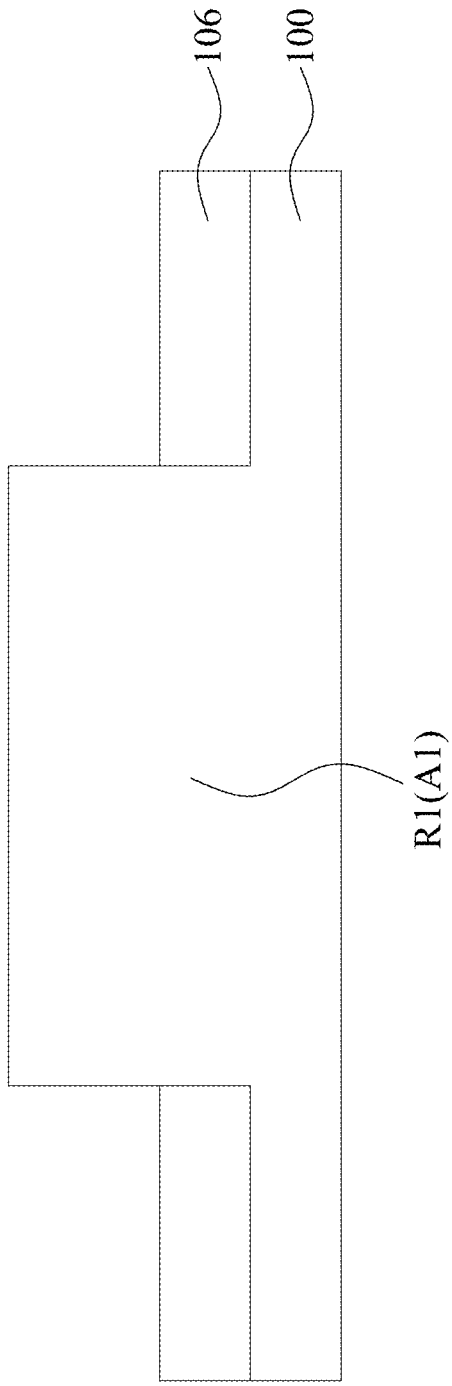

Reference is made to FIGS. 5A and 5B, in which FIG. 5A is a top view of a memory device, FIG. 5B is a cross-sectional view along line B-B of FIG. 5A. The substrate 100 is etched using the patterned mask MA1 (see FIGS. 4A and 4B) as an etching mask to form active region A1 protruding from the substrate 100. After the active region A1 is formed, the patterned mask MA1 may be removed by suitable process, such as strip. Then, an isolation structure 106 may be formed surrounding the patterned mask MA1. In some embodiments, the isolation structure 106 may be formed by, for example, depositing a dielectric material over substrate 100 and filling the spacers adjacent to the active region A1, performing a CMP process to level top surfaces of the dielectric material and the active region A1, followed by an etching back process to lower top surface of the dielectric material, in which the remaining dielectric material is referred to as the isolation structure 106. As discussed above, when viewed from above, the active region A1 includes two ring structures R1 and R2. Relevant structural details of the active region A1 are discussed in FIGS. 3A and 3C, and will not be repeated for brevity.

Figure 6A:
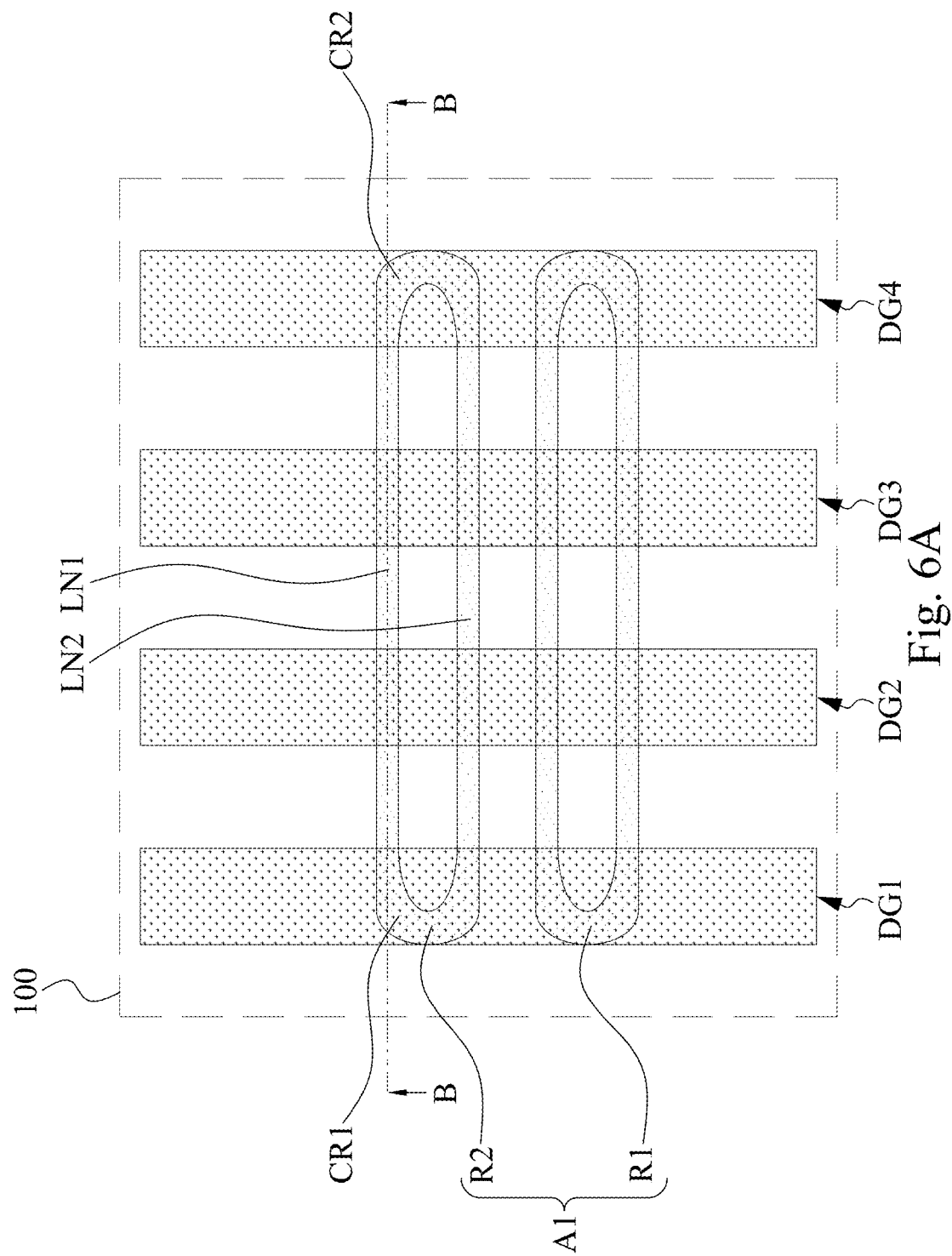
Figure 6B:
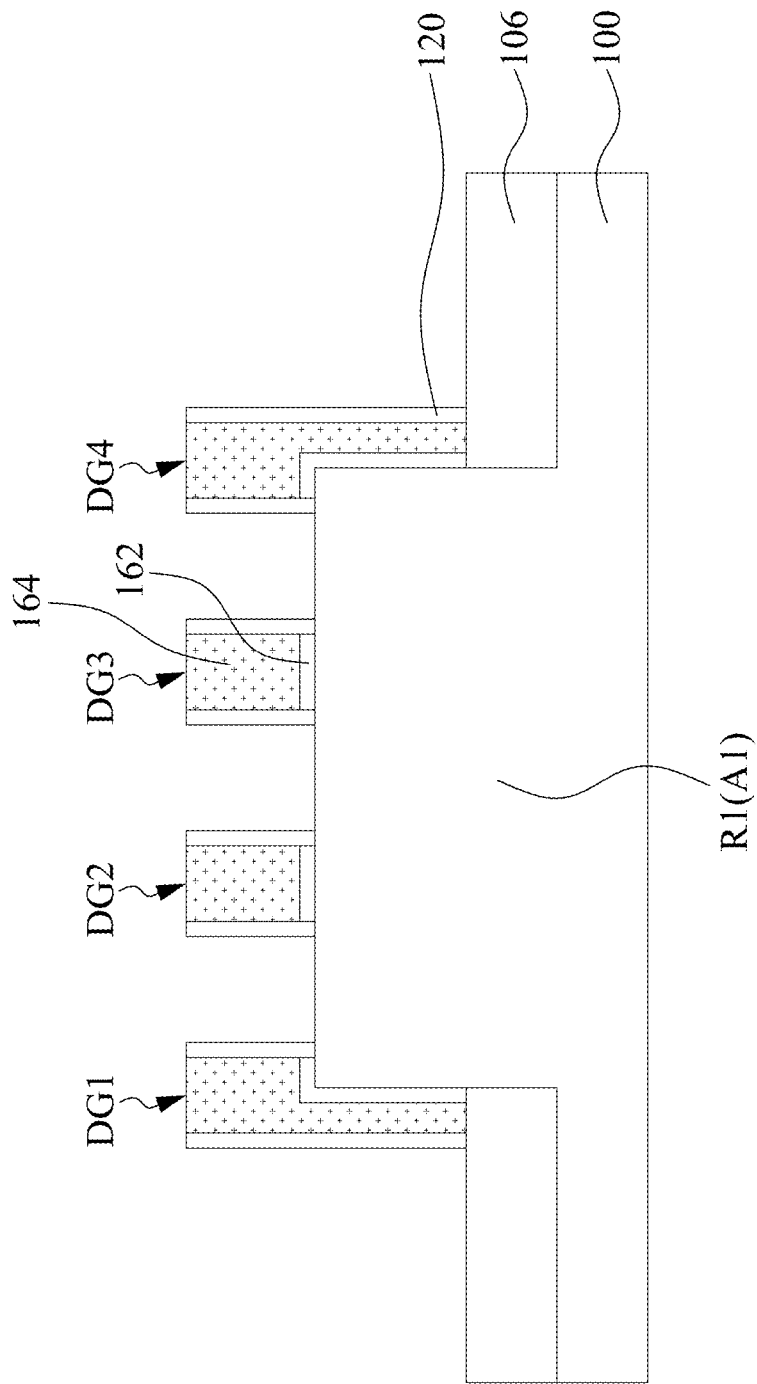

Reference is made to FIGS. 6A and 6B, in which FIG. 6A is a top view of a memory device, FIG. 6B is a cross-sectional view along line B-B of FIG. 6A. A plurality of dummy gate structures DG1, DG2, DG3, and DG4 are formed over the substrate 100 and crossing the active region A1. The structural relationship between the active region A1 and the dummy gate structures DG1, DG2, DG3, and DG4 is similar to and/or the same as the structural relationship between the active region A1 and the gate structures G1, G2, G3, and G4 as discussed in FIGS. 3A to 3C.

For example, the dummy gate structure DG1 crosses the curved portion CR1, the dummy gate structure DG1 contacts (010), (110), and (100) crystal planes of the curved portion CR1. In some embodiments, the relationship between the curved portion CR2 and the dummy gate structure DG4 is the same as described with respect to the curved portion CR1 and the dummy gate structure DG1, and thus relevant details are omitted for brevity.

On other hand, the dummy gate structure DG2 crosses the linear portions LN1 and LN2, the dummy gate structure DG2 substantially contacts the sidewalls of the linear portions LN1 and LN2 having (010) crystal plane. In some embodiments, the relationship between the linear portions LN1, LN2 and the dummy gate structure DG3 is the same as described with respect to the linear portions LN1, LN2 and the dummy gate structure DG2, and thus relevant details are omitted for brevity.

In some embodiments, the dummy gate structure DG1 contacts the (010), (110), and (100) crystal planes of the active region A1, while the dummy gate structure DG2 only contacts the (010) crystal plane of the active region A1. That is, the dummy gate structure DG2 does not contact the (110) and (100) crystal planes of the active region A1.

When viewed from above, the dummy gate structure DG1 form two interfaces with the ring structure R1 of the active region A1. For example, the dummy gate structure DG1 forms interfaces with an inner sidewall and an outer sidewall of the curved portion CR1. On the other hand, the dummy gate structure DG2 form four interfaces with the ring structure R1 of the active region A1. For example, the dummy gate structure DG1 forms interfaces with opposite sidewalls of the linear portion LN1 and opposite sidewalls of the linear portion LN2 of the active region A1. Accordingly, interfaces between the dummy gate structure DG1 and the active region A1 are less than interfaces between the dummy gate structure DG2 and the active region A1.

The total length of the inner sidewall and the outer sidewall of the curved portion CR1 that form interfaces with the dummy gate structure DG1 is greater than the total length of the opposite sidewalls of the linear portion LN1 and opposite sidewalls of the linear portion LN2 that form interfaces with the dummy gate structure DG2. Stated another way, the contact area between the dummy gate structure DG1 and the active region A1 is greater than the contact area between the dummy gate structure DG2 and the active region A1.

Each of the dummy gate structures DG1 to DG4 includes a gate dielectric layer 162 and a dummy gate layer 164. In some embodiments, the dummy gate structures DG1 to DG4 may be formed by, for example, depositing a gate dielectric material and a dummy gate material over the substrate 100, followed by a patterning process to pattern the gate dielectric material and the dummy gate material to form the dummy gate structures DG1 to DG4.

The gate dielectric layer 162 may be, for example, silicon oxide, silicon nitride, a combination thereof, or the like, and may be deposited or thermally grown according to acceptable techniques. The gate dielectric layer 162 may be formed by suitable process, such as chemical vapor deposition (CVD), physical vapor deposition (PVD), atomic layer deposition (ALD), or any suitable process. The dummy gate layer 164 may include polycrystalline-silicon (poly-Si) or poly-crystalline silicon-germanium (poly-SiGe). Further, the dummy gate layer 164 may be doped poly-silicon with uniform or non-uniform doping. The dummy gate layer 164 may be formed by suitable process, such as chemical vapor deposition (CVD), physical vapor deposition (PVD), atomic layer deposition (ALD), or any suitable process.

A plurality of gate spacers 120 are formed on opposite sidewalls of the dummy gate structures DG1 to DG4. The gate spacers 120 may be formed by, for example, depositing a spacer layer blanket over the dummy gate structures DG1 to DG4, followed by an etching process to remove horizontal portions of the spacer layer, such that vertical portions of the spacer layer remain on sidewalls of the dummy gate structures DG1 to DG4.

Figure 7:
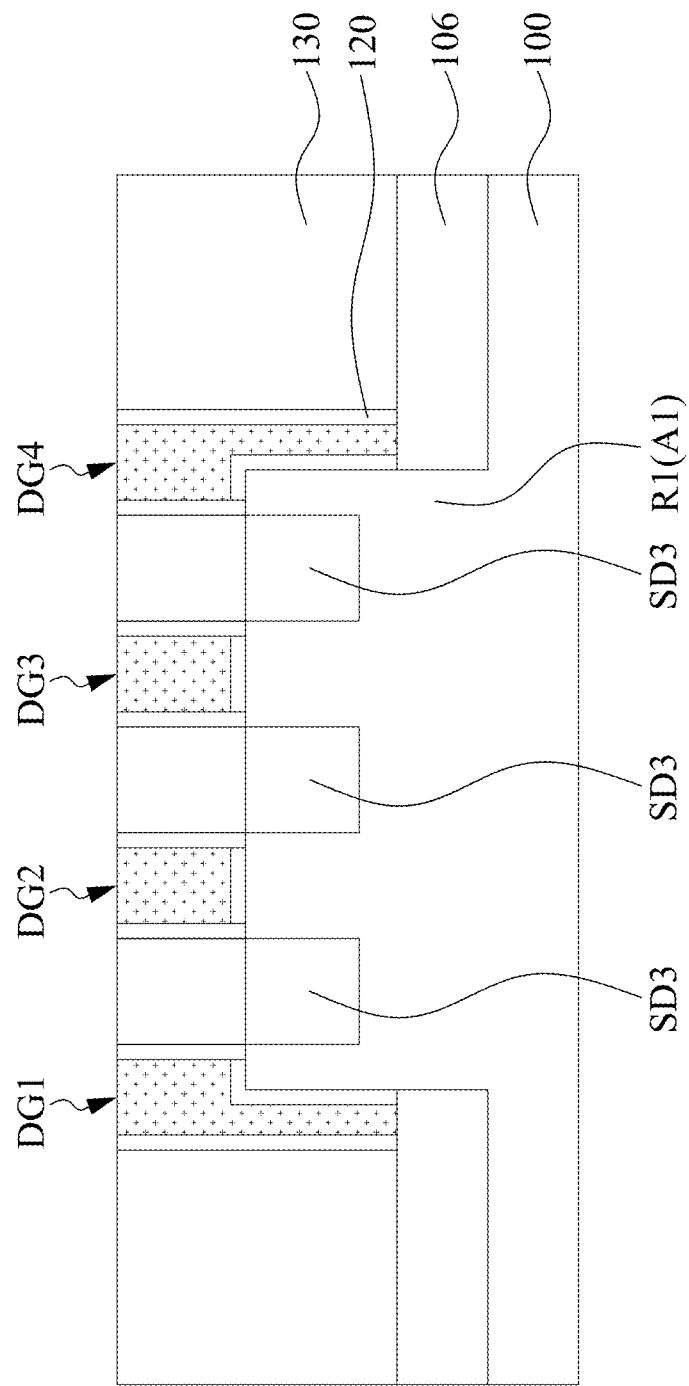

Reference is made to FIG. 7, in which FIG. 7 is a cross-section view following FIG. 6B. A plurality of source/drain structures SD1, SD2, and SD3 are formed in the active region A1. For example, the active region A1 exposed by the dummy gate structures DG1 to DG4 and the gate spacers 120 is recessed by suitable process, such as etching. Afterwards, the source/drain structures SD1 to SD3 are formed respectively over the exposed surfaces of the remaining active region A1. The source/drain structures SD1 to SD3 may be formed by performing an epitaxial growth process that grows an epitaxy semiconductor material from the channel region A1. The source/drain structures SD1 to SD3 are doped with an n-type impurity (e.g., phosphorous) or a p-type impurity (e.g., boron), depending on the conductivity-type of the respective resulting transistors.

An interlayer dielectric (ILD) layer 130 is formed adjacent to the gate spacers 120. For example, a dielectric layer is deposited blanket over the substrate 100 and filling the spaces between the gate spacers 120, followed by a CMP process to remove excessive material of the dielectric layer until the top surfaces of the dummy gate structures DG1 to DG4 are exposed.

Figure 8B:
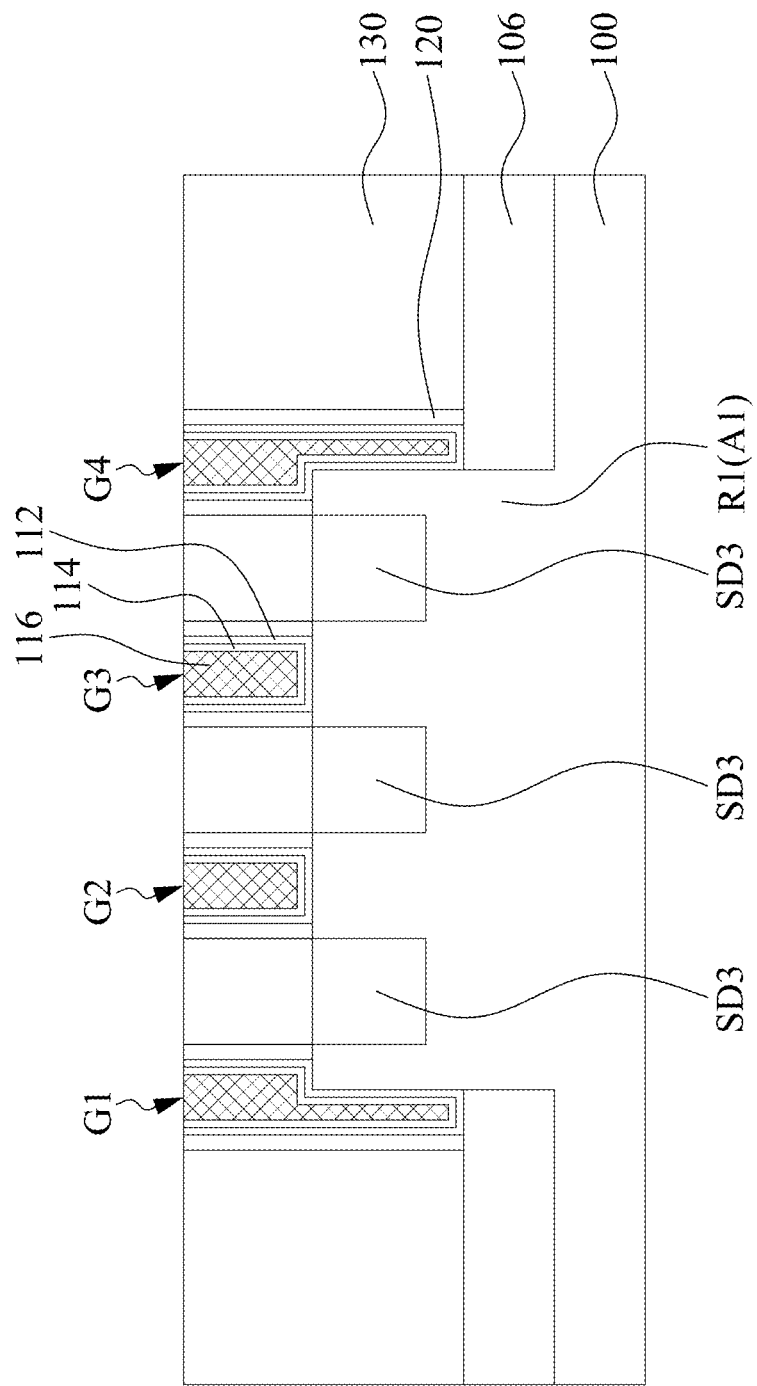

Reference is made to FIGS. 8A and 8B, in which FIG. 8A is a top view of a memory device, FIG. 8B is a cross-sectional view along line B-B of FIG. 8A. The dummy gate structures DG1 to DG4 are replaced with metal gate structures G1 to G4. In some embodiments, each of the gate structures G1 to G4 includes a gate dielectric layer 112, a work function metal layer 114, and a filling metal 116. For example, the dummy gate structures DG1 to DG4 are removed by an etching process to form gate trenches between the gate spacers 120, a gate dielectric material, a work function metal material, and a conductive material are formed sequentially in the gate trenches, followed by a CMP process to remove excessive materials of the gate dielectric material, the work function metal material, and the conductive material until the ILD layer 130 is exposed.

Figure 9A:
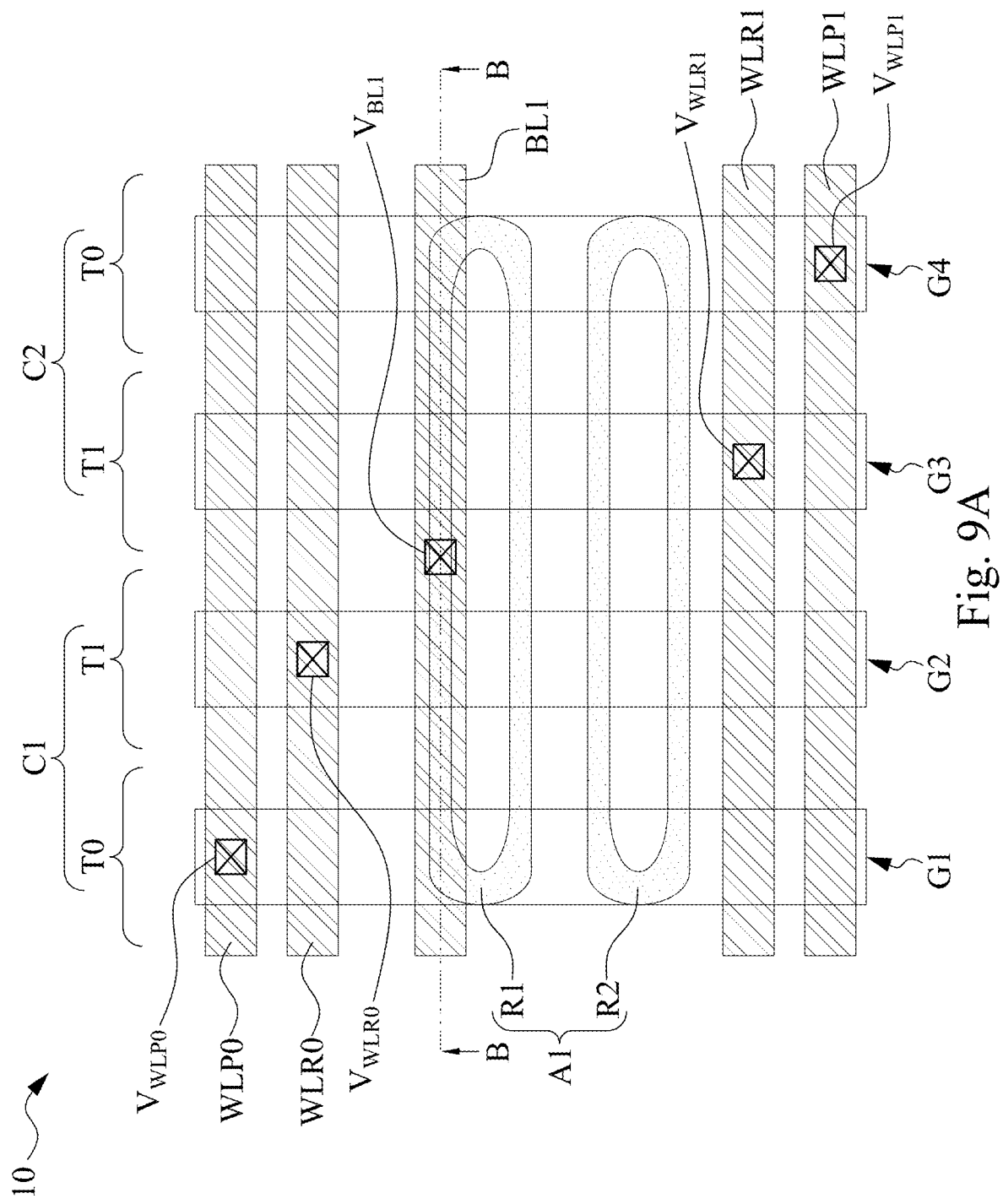
Figure 9B:
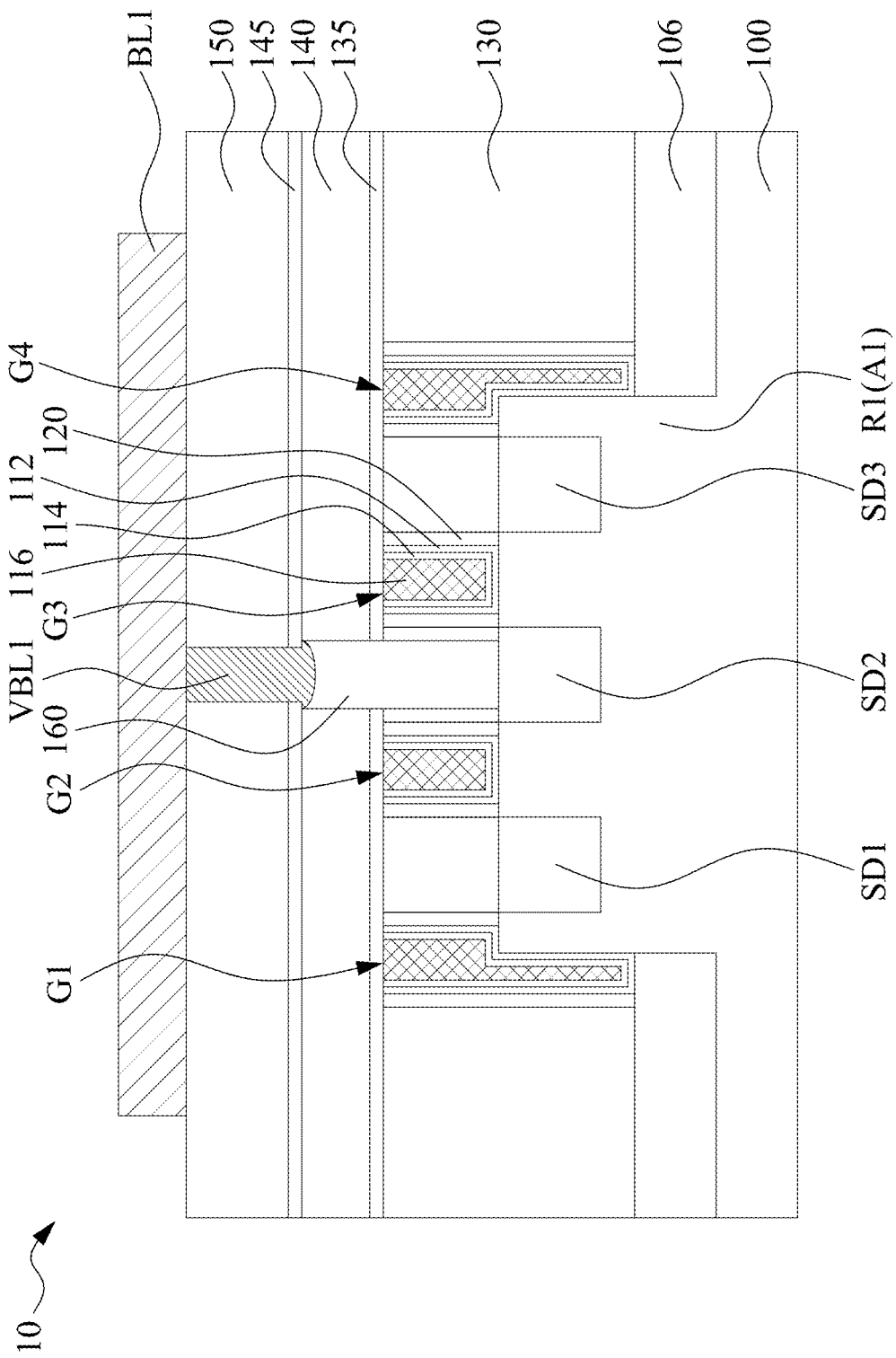

Reference is made to FIGS. 9A and 9B, in which FIG. 9A is a top view of a memory device, FIG. 9B is a cross-sectional view along line B-B of FIG. 9A. An etch stop layer (ESL) 135 and an interlayer dielectric (ILD) layer 140 are formed over the gate structures G1-G8. The ESL 135 can be formed using, for example, plasma enhanced CVD, low pressure CVD, ALD or other suitable techniques. The ILD layer 140 may be formed using, for example, CVD, ALD, spin-on-glass (SOG) or other suitable techniques.

A source/drain contact 160 is formed in contact with the source/drain structures. For example, the source/drain contact 160 is formed in contact with the source/drain structure SD2. In some embodiments, the source/drain contacts 160 may be formed by, for example, etching the ILD layer 140, the ESL 135, and the ILD layer 130 to form openings that expose the source/drain structures, filling conductive material in the openings, followed by a CMP process to remove excessive material of the conductive material until a top surface of the ILD layer 140 is exposed.

An etch stop layer (ESL) 145 and an interlayer dielectric (ILD) layer 150 are formed over the ILD layer 140. The ESL 145 can be formed using, for example, plasma enhanced CVD, low pressure CVD, ALD or other suitable techniques. The ILD layer 150 may be formed using, for example, CVD, ALD, spin-on-glass (SOG) or other suitable techniques.

A plurality of vias $V_{BL1}$, $V_{BL2}$, $V_{BL3}$, $V_{WLR0}$, $V_{WLP0}$, $V_{WLR1}$, and $V_{WLP1}$ are formed. For example, the vias $V_{BL1}$, $V_{BL2}$, $V_{BL3}$, $V_{WLR0}$, $V_{WLP0}$, $V_{WLR1}$, and $V_{WLP1}$ may be formed by, etching the ESL 135, ILD layer 140, ESL 145, and ILD layer 150 to from openings, forming a conductive layer in the openings, followed by a CMP process to remove excessive conductive layer until top surface of the ILD layer 150 is exposed. In some embodiments, the vias $V_{WLP0}$, $V_{WLR0}$, $V_{WLR1}$, and $V_{WLP1}$ are landed on the gate structures G1, G2, G3, and G4, respectively. In some embodiments, vias $V_{BL1}$ is landed on and in contact with the source/drain contact 160 over the active region A1.

Bit line BL1 and word lines WLP0, WLR0, WLP1, and WLR1 are formed over the ILD layer 150. For example, a conductive layer is deposited over the ILD layer 150, and the conductive layer is patterned according to a predetermined pattern. As a result, the portions of the remaining conductive layer over the vias $V_{BL1}$, $V_{WLP0}$, $V_{WLR0}$, $V_{WLP1}$, and $V_{WLR1}$ are referred to as the bit line BL1 and word lines WLP0, WLR0, WLP1, and WLR1, respectively.

Figure 10:
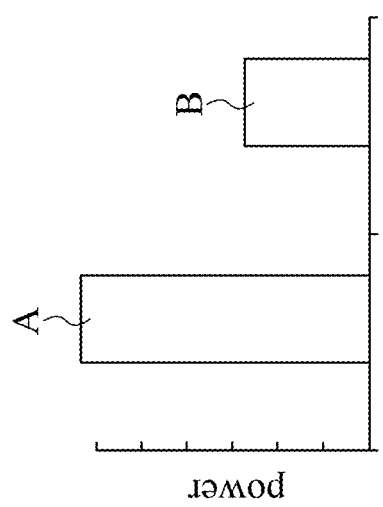
FIG. 10 illustrates a simulation result of a memory device in accordance with some embodiments of the present disclosure.

FIG. 10 illustrates simulation results of reduction of power by introducing the ring-shape active region into a memory device in accordance with some embodiments. Conditions A and B illustrate simulation results of the a memory device discussed above, in which Condition A is a simulation result of a memory device without the ring-shape active region A1 discussed above, and Condition B is a simulation result of a memory device with the ring-shape active region A1 discussed above. As shown in FIG. 10, comparing Condition A with Condition B, it is clear that forming the ring-shape active region A1 in a memory device can reduce power of the memory device. In some embodiments where the ring-shape active region A1 is introduced in the memory device, the power of the memory device can be reduce about 60%, and the breakdown voltage of the transistors of the memory device (such as the transistors T0 discussed in FIG. 1) can be reduced about 0.3 V.

Figure 11:
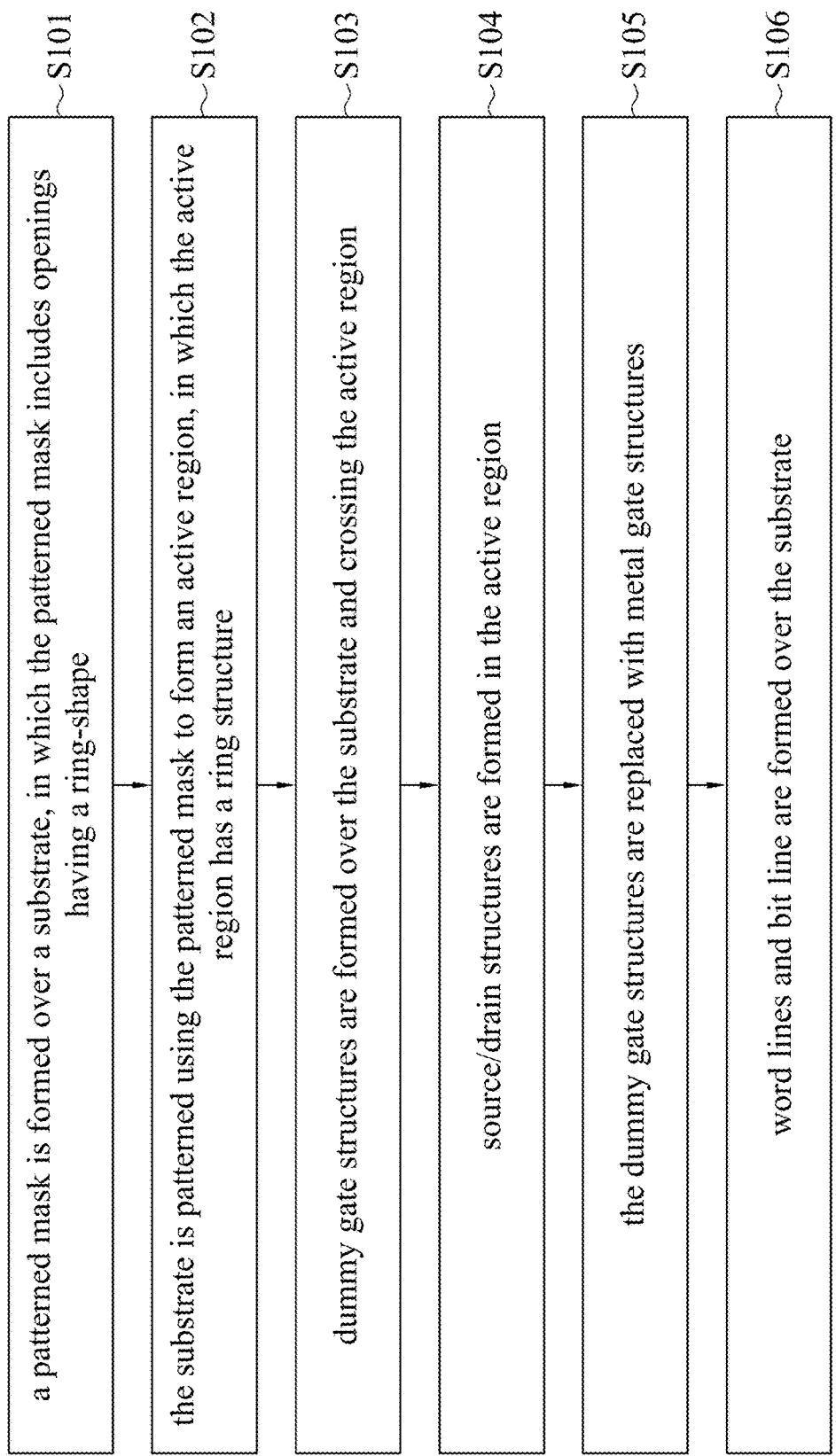
FIG. 11 is a method of manufacturing a memory device in accordance with some embodiments of the present disclosure.

FIG. 11 illustrates a method M1 of manufacturing a memory device in accordance with some embodiments of the present disclosure. Although the method 1000 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, a patterned mask is formed over a substrate, in which the patterned mask includes openings having a ring-shape. FIGS. 4A and 4B illustrate schematic views of some embodiments corresponding to act in block S101.

At block S102, the substrate is patterned using the patterned mask as an etching mask to form an active region, in which the active region has a ring structure. FIGS. 5A and 5B illustrate schematic views of some embodiments corresponding to act in block S102.

At block S103, dummy gate structures are formed over the substrate and crossing the active region. FIGS. 6A and 6B illustrate schematic views of some embodiments corresponding to act in block S103.

At block S104, source/drain structures are formed in the active region. FIG. 7 illustrates schematic views of some embodiments corresponding to act in block S104.

At block S105, the dummy gate structures are replaced with metal gate structures. FIGS. 8A and 8B illustrate schematic views of some embodiments corresponding to act in block S105.

At block S106, word lines and bit line are formed over the substrate. FIGS. 9A and 9B illustrate schematic views of some embodiments corresponding to act in block S106.

Figure 12A:
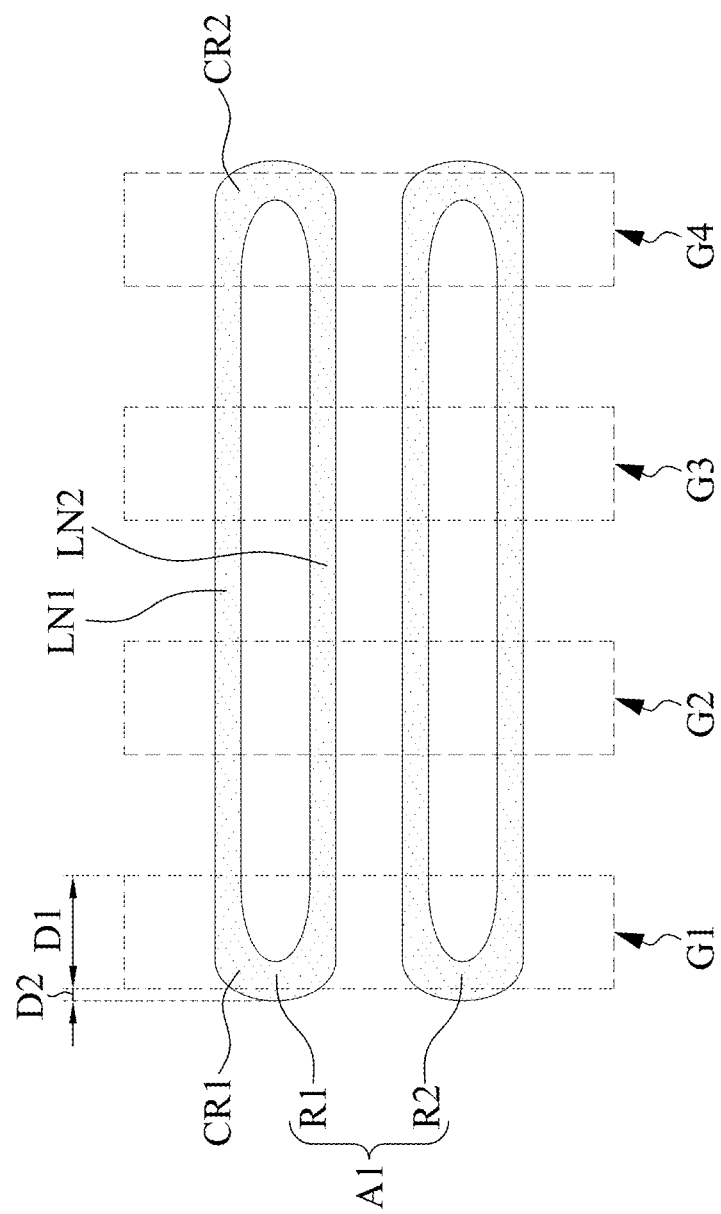
FIGS. 12A and 12B are top views of memory devices in accordance with some embodiments.
Figure 12B:
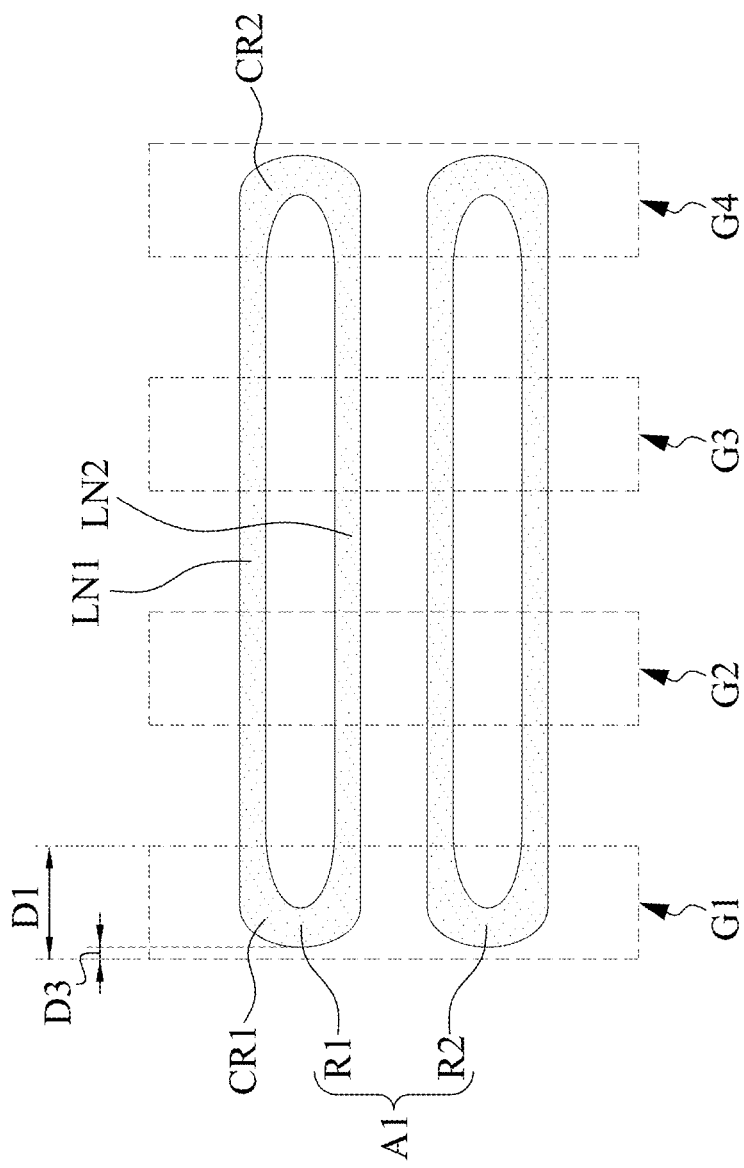

FIGS. 12A and 12B are top views of memory devices in accordance with some embodiments. It is noted that the top views illustrated in FIGS. 12A and 12B are the same as the top view of FIG. 3C, and thus similar elements are labeled the same and will not be repeated for brevity.

In FIG. 12A, the gate structures G1 and G4 cross the curved portions CR1 and CR2 of the ring structures R1 and R2 of the active region A1, respectively. Along the lengthwise direction of the active region A1, an outmost edge of the gate structure G1 and an outmost edge of the curved portion CR1 are misaligned. In greater detail, the outmost edge of the curved portion CR1 extends beyond the outmost edge of the gate structure G1 toward a direction distal to the linear portions LN1 and LN2 of the ring structures R1 and R2 of the active region A1. As a result, the outmost edge of the curved portion CR1 is separated from the outmost edge of the gate structure G1 by a non-zero distance. On the other hand, when viewed from above, the gate structure G1 only partially overlaps the curved portion CR1. That is, the outmost part of the curved portion CR1 is not overlapped by the gate structure G1, which results in that the gate structure G1 froms three interfaces with the ring structure R1 when viewed from above. The structural relationship between the gate structure G4 and curved portion CR2 is the same as the structural relationship between the gate structure G1 and curved portion CR1, and thus relevant details will not be repeated for brevity.

In some embodiments, along the lengthwise direction of the active region A1 (or the direction perpendicular to the gate structure G1), the gate structure G1 has a width D1. In some embodiments, the width D1 is in a range from about 5 nm to about 40 nm. On the other hand, the outmost edge of the gate structure G1 and the outmost edge of the curved portion CR1 are separated by a distance D2. In some embodiments, the distance D2 is in a range from about 0 nm to about 10 nm. In some embodiments, the ratio of distance D2 to the width D1 is in a range from about 0 to about 0.1. If the ratio is too large (e.g., far beyond 0.1), the device performance may be unsatisfied.

In FIG. 12B, the gate structures G1 and G4 cross the curved portions CR1 and CR2 of the ring structures R1 and R2 of the active region A1, respectively. Along the lengthwise direction of the active region A1, an outmost edge of the gate structure G1 and an outmost edge of the curved portion CR1 are misaligned. In greater detail, the outmost edge of the gate structure G1 extends beyond the outmost edge of the curved portion CR1 toward a direction distal to the linear portions LN1 and LN2 of the ring structures R1 and R2 of the active region A1. As a result, the outmost edge of the curved portion CR1 is separated from the outmost edge of the gate structure G1 by a non-zero distance. On the other hand, when viewed from above, the gate structure G1 entirely overlaps the curved portion CR1.

In some embodiments, along the lengthwise direction of the active region A1 (or the direction perpendicular to the gate structure G1), the gate structure G1 has a width D1. In some embodiments, the width D1 is in a range from about 5 nm to about 40 nm. On the other hand, the outmost edge of the gate structure G1 and the outmost edge of the curved portion CR1 are separated by a distance D3. In some embodiments, the distance D3 is in a range from about 0 nm to about 10 nm. In some embodiments, the ratio of distance D3 to the width D1 is in a range from about 0 to about 0.1. If the ratio is too large (e.g., far beyond 0.1), the device performance may be unsatisfied.

According to the aforementioned embodiments, it can be seen that the present disclosure offers advantages in fabricating semiconductor devices. It is understood, however, that other embodiments may offer additional advantages, and not all advantages are necessarily disclosed herein, and that no particular advantage is required for all embodiments. One advantage is that an active region of a memory device is formed having a ring structure, such that a contact area between a gate structure and the active region is increased, which also results in increased length of the edges (or corners) of the active region that contact the gate structure. Because the gate dielectric layer of the gate structure contacts edges (or corners) of the active region A1, the gate dielectric layer may cause high electric fields at these edges (or corners) due to "point discharge effect." The electric fields may contribute to the voltage for destroying the gate dielectric layer of the transistors of the memory device. Accordingly, the breakdown voltage of the transistors of memory device can be reduced, and thus the power of the memory device may also be reduced. Another advantage is that, the ring structure of the active region can save spacer of the memory device, which in turn will increase the device density of the memory device.

In some embodiments of the present disclosure, a memory device includes a substrate, an active region, a first gate structure, a second gate structure, a first word line, and a second word line. The active region protrudes from a top surface of the substrate. The active region has at least one ring structure, in which when viewed from above, the ring structure has a first linear portion, a second linear portion, a first curved portion, and a second curved portion, the first curved portion connects first sides of the first and second linear portions, and the second curved portion connects second sides of the first and second linear portions. The first gate structure and the second gate structure are over the substrate and cross the active region. The first word line and the second word line are electrically connected to the first gate structure and the second gate structure, respectively.

In some embodiments of the present disclosure, a memory device includes a substrate, an active region, a first gate structure, a second gate structure, a first word line, and a second word line. The active region protrudes from a top surface of the substrate, the active region has at least one ring structure, in which a sidewall of the active region includes a (010) crystal plane, a (110) crystal plane, and a (100) crystal plane. The first gate structure and the second gate structure are over the substrate and crossing the active region, in which the first gate structure is in contact with the (010) crystal plane, the (110) crystal plane, and the (100) crystal plane of the sidewall of the active region. The first word line and the second word line electrically connected to the first gate structure and the second gate structure, respectively.

In some embodiments of the present disclosure, a method includes forming a patterned mask having an opening over a substrate, in which the opening of the patterned mask has a ring shape; etching the substrate by using the patterned mask as an etch mask to form an active region having a ring shape protruding from the substrate; forming a first dummy gate structure and a second dummy gate structure over the active region; replacing the first dummy gate structure and the second dummy gate structure with a first metal gate structure and a second metal gate structure; and forming a first word line and a second word line electrically connected to the first metal gate structure and the second metal gate structure, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a patterned mask having an opening over a substrate, wherein the opening of the patterned mask has a ring shape;
   etching the substrate by using the patterned mask as an etch mask to form an active region having a ring shape protruding from the substrate, wherein etching the substrate to form the active region is performed such that a sidewall of the active region includes a (010) crystal plane, a (110) crystal plane, and a (100) crystal plane;
   forming a first dummy gate structure and a second dummy gate structure over the active region;
   replacing the first dummy gate structure and the second dummy gate structure with a first metal gate structure and a second metal gate structure; and
   forming a first word line and a second word line electrically connected to the first metal gate structure and the second metal gate structure, respectively.

2. The method of claim 1, wherein the ring shape of the opening has a first linear portion, a second linear portion, a first curved portion, and a second curved portion, the first curved portion connects first sides of the first and second linear portions, and the second curved portion connects second sides of the first and second linear portions.

3. The method of claim 2, wherein the first linear portion and the second linear portion are arranged along a direction perpendicular to a lengthwise direction of the first and second dummy gate structures.

4. The method of claim 1, wherein forming the first dummy gate structure and the second dummy gate structure is performed such that the first dummy gate structure is in contact with the (010) crystal plane, the (110) crystal plane, and the (100) crystal plane of the sidewall of the active region.

5. The method of claim 1, further comprising:
   forming a source/drain structure over the active region and between the first dummy gate structure and the second dummy gate structure; and
   forming a bit line electrically connected to the source/drain structure.

6. A method, comprising:
   patterning a substrate to form an active region protruding from a top surface of the substrate, the active region having at least one ring structure, wherein when viewed from above, the ring structure has a first linear portion, a second linear portion, a first curved portion, and a second curved portion, the first curved portion connects first sides of the first and second linear portions, and the second curved portion connects second sides of the first and second linear portions;
   forming a first gate structure and a second gate structure over the substrate and crossing the active region; and
   forming a first word line and a second word line electrically connected to the first gate structure and the second gate structure, respectively.

7. The method of claim 6, wherein the first gate structure overlaps the first curved portion of the ring structure, and the second gate structure overlaps the first and second linear portions of the ring structure.

8. The method of claim 6, wherein:
   a sidewall of the first curved portion of the ring structure includes a first segment having (010) crystal plane, a second segment having a (110) crystal plane, and a third segment having a (100) crystal plane; and
   the first gate structure is in contact with the first, second, and third segments of the first curved portion of the ring structure.

9. The method of claim 6, wherein:
   opposite sidewalls of the first linear portion and opposite sidewalls of the second linear portion have a (010) crystal plane; and
   the second gate structure is in contact with the opposite sidewalls of the first linear portion and the opposite sidewalls of the second linear portion.

10. The method of claim 6, wherein the first and second linear portions of the ring structure extend along a direction substantially perpendicular to a lengthwise direction of the first and second gate structures.

11. The method of claim 6, further comprising:
   forming a third gate structure and a fourth gate structure over the substrate and crossing the active region, wherein the third gate structure overlaps the first and second linear portions of the ring structure, and the fourth gate structure overlaps the second curved portion of the ring structure; and
   forming a third word line and a fourth word line electrically connected to the third gate structure and the fourth gate structure, respectively.

12. The method of claim 11, further comprising:

forming a source/drain structure over the active region and between the second gate structure and the third gate structure; and forming a bit line electrically connected to the source/drain structure.

13. The method of claim 6, wherein a plurality of ring structures are formed arranged along a lengthwise direction of the first and second gate structures.

14. The method of claim 6, wherein a contact area between a top surface of the active region and the first gate structure is greater than a contact area between the top surface of the active region and the second gate structure.

15. The method of claim 6, wherein along a direction substantially perpendicular to a lengthwise direction of the first and second gate structures, an outmost edge of the first curved portion of the ring structure of the active region is separated from the an outmost edge of the first gate structure by a non-zero distance.

16. A method, comprising:

patterning a substrate to form an active region protruding from a top surface of the substrate, the active region having at least one ring structure, wherein a sidewall of the active region includes a (010) crystal plane, a (110) crystal plane, and a (100) crystal plane;

forming a first gate structure and a second gate structure over the substrate and crossing the active region, wherein the first gate structure is in contact with the (010) crystal plane, the (110) crystal plane, and the (100) crystal plane of the sidewall of the active region; and forming a first word line and a second word line electrically connected to the first gate structure and the second gate structure, respectively.

17. The method of claim 16, wherein the second gate structure is in contact with the (010) crystal plane of the active region, and is not in contact with the (110) crystal plane, and the (100) crystal plane of the sidewall of the active region.

18. The method of claim 16, wherein the first gate structure form a plurality interfaces with the active region, and the second gate structure form a plurality interfaces with the active region, and a number of the interfaces between the first gate structure and the active region is less than a number of the interfaces between the second gate structure and the active region.

19. The method of claim 18, wherein a total length of the interfaces between the first gate structure and the active region is greater than a total length of the interfaces between the second gate structure and the active region.

20. The method of claim 16, wherein when viewed from above, the ring structure has a first linear portion, a second linear portion, a first curved portion, and a second curved portion, the first curved portion connects first sides of the first and second linear portions, and the second curved portion connects second sides of the first and second linear portions.

* * * * *